(12) United States Patent
Fujimoto et al.

(10) Patent No.: US 7,741,649 B2
(45) Date of Patent: Jun. 22, 2010

(54) SEMICONDUCTOR LIGHT EMITTING DEVICE AND METHOD FOR MANUFACTURING THE SAME

(75) Inventors: Akira Fujimoto, Kawasaki (JP); Koji Asakawa, Tokyo (JP); Kenichi Ohashi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/246,099

(22) Filed: Oct. 6, 2008

(65) Prior Publication Data

US 2009/0042325 A1 Feb. 12, 2009

Related U.S. Application Data

(62) Division of application No. 11/220,637, filed on Sep. 8, 2005, now Pat. No. 7,476,910.

(30) Foreign Application Priority Data

Sep. 10, 2004 (JP) ............................. 2004-263741

(51) Int. Cl.
*H01L 29/207* (2006.01)
(52) U.S. Cl. ............... 257/95; 257/98; 257/E33.006; 438/29
(58) Field of Classification Search ............... 438/29, 438/32, 42, 943–952; 257/12, 13, 79, 94, 257/95, 98, E33.006; 372/43.01
See application file for complete search history.

(56) References Cited

U.S. PATENT DOCUMENTS

| | | |
|---|---|---|
| 5,779,924 A | 7/1998 | Krames et al. |
| 6,122,103 A | 9/2000 | Perkins et al. |
| 6,565,763 B1 * | 5/2003 | Asakawa et al. ............. 216/56 |

(Continued)

FOREIGN PATENT DOCUMENTS

JP    2000-299494    10/2000

(Continued)

OTHER PUBLICATIONS

Y. Kanamori, et al., "100 nm period silicon antireflection structures fabricated using a porous alumina membrance mask", Applied Physics Letters, vol. 78, No. 2, Jan. 8, 2001, pp. 142-143.

*Primary Examiner*—Zandra Smith
*Assistant Examiner*—Paul E Patton
(74) *Attorney, Agent, or Firm*—Oblon, Spivak, McClelland, Maier & Neustadt, L.L.P.

(57) ABSTRACT

In a semiconductor light emitting device, a semiconductor light emitting element has a light extracted surface on which a plurality of convex structures is formed. The convex structures each have a conical mesa portion constituting a refractive index gradient structure, a cylindrical portion constituting a diffraction grating structure, and a conical portion constituting a refractive index gradient structure. The mesa portion, cylindrical portion, and conical portion are arranged in this order from the light extracted surface. The period between the convex structures is longer than 1/(the refractive index of an external medium+the refractive index of the convex structures) of an emission wavelength and equal to or shorter than the emission wavelength. The circle-equivalent average diameter of the cylindrical portion is ⅓ to 9/10 of that of the bottom of the mesa portion.

10 Claims, 9 Drawing Sheets

U.S. PATENT DOCUMENTS

| | | | |
|---|---|---|---|
| 6,657,236 B1 | 12/2003 | Thibeault et al. | |
| 6,791,119 B2 * | 9/2004 | Slater et al. | 257/99 |
| 6,838,297 B2 | 1/2005 | Iwasaki et al. | |
| 7,012,279 B2 | 3/2006 | Wierer Jr. et al. | |
| 2006/0186424 A1 | 8/2006 | Fujimoto et al. | |

FOREIGN PATENT DOCUMENTS

| | | |
|---|---|---|
| JP | 2003-218383 | 7/2003 |
| JP | 2003-258296 | 9/2003 |
| JP | 2004-258380 | 9/2004 |

* cited by examiner

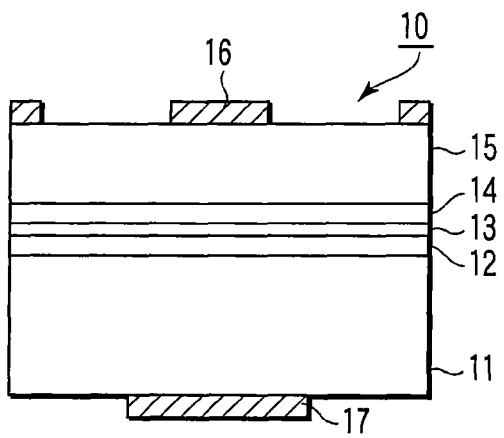
F I G. 9A
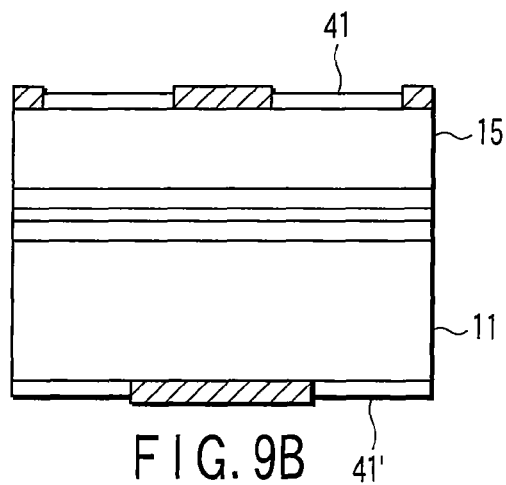
F I G. 9B
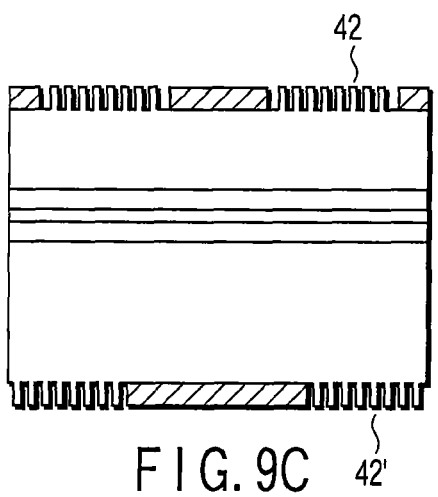
F I G. 9C
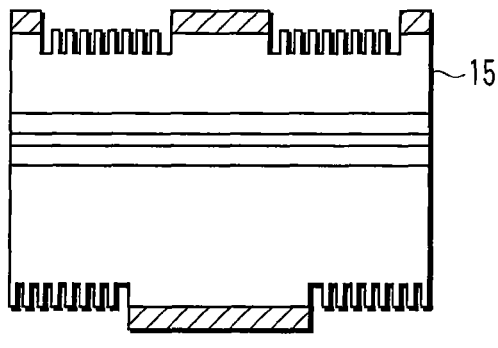
F I G. 9D
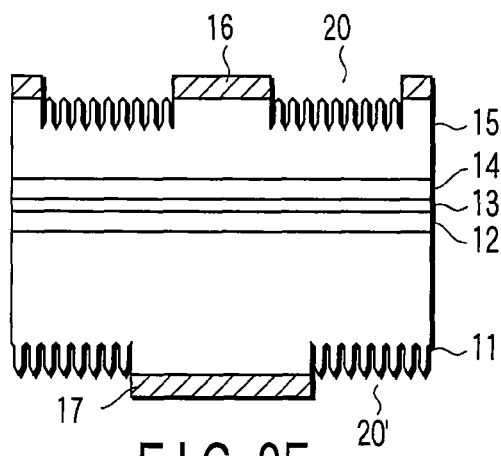
F I G. 9E

SEMICONDUCTOR LIGHT EMITTING DEVICE AND METHOD FOR MANUFACTURING THE SAME

CROSS-REFERENCE TO RELATED APPLICATIONS

This application is a divisional of and claims the benefit of priority under 35 U.S.C. §120 from U.S. application Ser. No. 11/220,637, filed Sep. 8, 2005, and claims the benefit of priority under 35 U.S.C. §119 from Japanese Patent Application No. 2004-263741, filed Sep. 10, 2004, the entire contents of which are incorporated herein by reference.

BACKGROUND OF THE INVENTION

1. Field of the Invention

The present invention relates to a semiconductor light emitting device such as a light emitting diode or a semiconductor laser, and in particular, to a semiconductor light emitting device having an improved light extraction efficiency, and a method for manufacturing the semiconductor light emitting device.

2. Description of the Related Art

In order to improve the light extraction efficiency of a semiconductor light emitting device, attempts have been made to form a regular structure (concaves and convexes) of a nanometer size on a front surface of the light emitting device (Applied Physics Letters, 142, vol. 78, 2001, Jpn. J. Appl. Phys., L735, vol139, 2000). Since the period of the concaves and convexes has a nanometer size, the concave and convex region behaves like a layer that smoothly varies the refractive indices from the surface of the semiconductor to air. Thus, no reflection occurs and the light is completely transmitted through the semiconductor.

However, with such a structure, the light extraction efficiency varies greatly depending on the shape of the concave and convex region. Consequently, the structure has not produced sufficient effects. Further, the above regular structure must be produced by drawing based on electron light, etching, or the like. Thus, the fabrication of the structure requires high manufacturing costs and has a low productivity. Therefore, the structure is not practical. Moreover, since the regular structure must be produced so as to have a nanometer size, the margin of the process is low.

Further, in order to form a structure of a nanometer size on the surface of the light emitting device, the surface is etched using a resin composition to form a micro phase separation structure as a mask. After selectively removal of one of the phases of the micro phase separation structure, a base surface is etched using the other phase as an etching mask (Jpn. Pat. Appln. Publication No. 2003-258296). In another known method, the front surface of the light emitting device is roughened by treating the surface using hydrochloric acid, sulfuric acid, hydrogen peroxide, or their mixture (Jpn. Pat. Appln. Publication No. 2000-299494).

However, these methods are susceptible to the crystal face of the substrate. That is, some exposed faces can be roughened but others cannot, depending on the orientation of the crystal face. Thus, the light extracted surface cannot be always roughened, thus limiting the improvement of the light extraction efficiency. Further, the shape of the concaves and convexes significantly affects the light extraction efficiency. The desired shape has not been identified so far.

As described above, in order to improve the light extraction efficiency, fine concave and convex structures on the surface of the semiconductor light emitting device have been attempted to form. However, sufficient effects have not been obtained because optimum shapes of the concave and convex structures were unknown. Furthermore, it is very difficult to highly reproducibly form fine concave and convex structures on the surface of the light emitting surface.

BRIEF SUMMARY OF THE INVENTION

According to an aspect of the present invention, there is provided a semiconductor light emitting device comprising:

a semiconductor light emitting element including a light extracted surface on which a plurality of convex structures are formed;

the convex structures each including a conical mesa portion configuring a refractive index gradient structure, a cylindrical portion configuring a diffraction grating structure, and a conical portion configuring a refractive index gradient structure, the mesa portion, the cylindrical portion, and the conical portion being arranged in this order from the light extracted surface toward exterior, wherein an period between the convex structures is longer than 1/(a refractive index of an external medium+a refractive index of the convex structures) of an emission wavelength and equal to or shorter than the emission wavelength, and a circle-equivalent average diameter of the cylindrical portion is ⅓ to 9/10 of that of a bottom of the mesa portion.

According to another aspect of the present invention, there is provided a semiconductor light emitting device comprising:

a semiconductor light emitting element including a light extracted surface on which a plurality of convex structures are formed;

the convex structures each including a conical mesa portion configuring a refractive index gradient structure, a cylindrical portion configuring a diffraction grating structure, and a conical portion configuring a refractive index gradient structure, the mesa portion, the cylindrical portion, and the conical portion being arranged in this order from the light extracted surface toward exterior, wherein an period between the convex structures is longer than 1/(a refractive index of an external medium+a refractive index of the convex structures) of an emission wavelength and equal to or shorter than the emission wavelength, and an average height of the convex structures is 0.6 to 1.5 times as large as the emission wavelength, a circle-equivalent average diameter of the cylindrical portion is ⅓ to 9/10 of that of a bottom of the mesa portion, and an average height of the cylindrical portion is at least 3/10 of the emission wavelength and is equal to or smaller than the emission wavelength, a circle-equivalent average diameter of a top of the mesa portion is equivalent to that of the cylindrical portion, a circle-equivalent average diameter of a bottom of the mesa portion is longer than 1/(the refractive index of the external medium+ the refractive index of the convex structures) and equal to or shorter than the emission wavelength, and an average height of the mesa portion is 1/10 to ⅕ of the emission wavelength, and a circle-equivalent average diameter of a bottom of the conical portion is equivalent to that of the cylindrical portion, and an average height of the conical portion is at least 1/10 of the emission wavelength and is equal to or smaller than the emission wavelength.

According to another aspect of the present invention, there is provided a method for manufacturing a semiconductor light emitting device comprising a semiconductor light emitting element, the method comprising:

forming a mask on which circular patterns are periodically arranged, on a light extracted surface of a semiconductor light emitting element, the light extracted surface of the semiconductor light emitting element is selectively etched by a reactive ion etching technique using the mask to form convex structures each including a conical mesa portion configuring a refractive index gradient structure, a cylindrical portion constituting a diffraction grating structure, and a conical portion configuring a refractive index gradient structure, the mesa portion, the cylindrical portion, and the conical portion being arranged in this order from the light extracted surface, and an period between the convex structures is longer than 1/(a refractive index of an external medium+a refractive index of the convex structures) of an emission wavelength and equal to or shorter than the emission wavelength, and a circle-equivalent average diameter of the cylindrical portion is ⅓ to 9/10 of that of a bottom of the mesa portion.

According to another aspect of the present invention, there is provided a method for manufacturing a semiconductor light emitting device comprising a semiconductor light emitting element, the method comprising:

forming a mask on which circular patterns are periodically arranged, on a light extracted surface of a semiconductor light emitting element;

the light extracted surface is selectively etched by a reactive ion etching technique using the mask to form a cylindrical portion of each of convex structures configuring a diffraction grating structure and setting an period between the convex structures longer than 1/(a refractive index of an external medium+a refractive index of the convex structures) of an emission wavelength and equal to or shorter than the emission wavelength; and etching the light extracted surface by a physical etching technique using an inert gas to form a conical mesa portion configuring a refractive index gradient structure at a bottom of each of the cylindrical portions, forming a conical portion configuring a refractive index gradient structure at a top of the cylindrical portion, and setting a circle-equivalent average diameter of the cylindrical portion ⅓ to 9/10 of that of a bottom of the mesa portion.

BRIEF DESCRIPTION OF THE SEVERAL VIEWS OF THE DRAWING

FIGS. 9A to 9E are sectional views showing a process for manufacturing a light emitting diode according to a seventh example;

DETAILED DESCRIPTION OF THE INVENTION

The principle of the present invention will be described before embodiments of the present invention.

The inventors concentrated their energy on studies and various experiments in order to improve the light extraction efficiency of a semiconductor light emitting device. As a result, the inventors have found that the light extraction efficiency is significantly improved by forming convex structures on a light extracted surface and optimizing the convex structures.

Figure 1:
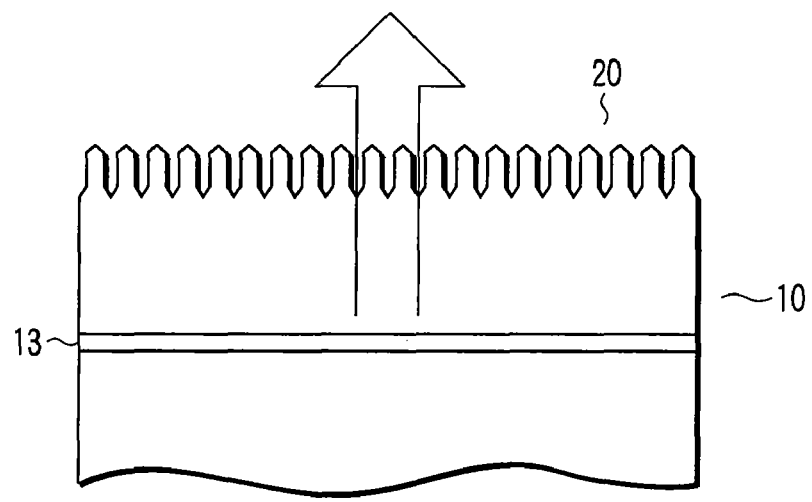
FIG. 1 is a sectional view showing the basic configuration of a semiconductor light emitting device according to the present invention.

FIG. 1 is a diagram showing the basic configuration of a semiconductor light emitting device according to the present invention. Convex structures 20 of a three-stage configuration described below are formed on a light extracted surface of a face-emitting semiconductor light emitting element substrate 10 having a light emitting layer 13.

The light extracted surface is the outermost layer surface of light radiation side of the light emitting element substrate 10. The light extracted surface is generally a current diffusion layer, on which the convex structures 20 are formed. An electrode is formed on a part of the current diffusion layer. A part of surface of the current diffusion layer on which the electrode is not formed is the light extracted surface; the convex structures 20 are formed on this part. Further, an inorganic light transmission layer is formed on the current diffusion layer and has a refractive index equivalent to that of the current diffusion layer. The convex structures 20 may be formed on the inorganic light transmission layer. The convex structures 20 are preferably formed directly on the exposed surface of the current diffusion layer on which the electrode is not formed because this process is easy and accomplishes high light extraction efficiency.

Each of the convex structures 20 comprises three portions, a mesa portion 21 constituting a refractive index gradient structure, a cylindrical portion 22 constituting a diffractive grating structure, and a conical portion 23 constituting a refractive index gradient structure.

The arrangement period H between the convex structures 20 is longer than 1/(the refractive index of an external medium+the refractive index of the substrate) and is equal to or smaller than an emission wavelength. Here, the refractive index of the external medium is smaller than the refractive index of the substrate. The circle-equivalent average diameter C of the cylindrical portion 22 of each convex structure 20 is ⅓ to 9/10 of the circle-equivalent average diameter of the bottom of the mesa portion 21 of the convex structure 20. Moreover, the average height B of the convex structure 20 is 0.6 to 1.5 times as large as the emission wavelength.

The three portions 21, 22, and 23 constituting the convex structure 20 have such sizes and heights as described below.

(Cylindrical Portion)

The average height E of the cylindrical portion 22 is at least 3/10 of the emission wavelength and at most equal to the emission wavelength.

(Mesa Portion)

The circle-equivalent average diameter A of the bottom of the mesa portion 21 is longer than 1/(the refractive index of an external medium+the refractive index of the substrate) and is equal to or smaller than an emission wavelength. The circle-equivalent average diameter C of the top of the mesa portion 21 is equivalent to that C of the cylindrical portion 22. The average height D of the mesa portion 21 is 1/10 to 1/5 of the emission wavelength.

(Conical Portion)

The circle-equivalent average diameter F of the bottom side of the conical portion 23 is equivalent to that of the top portion of the cylindrical portion 22. The average height G of the conical portion 23 is at least 1/10 of the emission wavelength and at most equal to the emission wavelength.

Here, the period between the convex structures 20 is defined as the inter-vertex distance of the conical portion 23 of the convex structure 20. The circle-equivalent average diameter F of the bottom surface of each of the cylindrical portion 22 and conical portion 23 is defined as $2 \times (area/\pi)^{0.5}$. For the cylindrical portion 22 and conical portion 23, the circularity coefficient of the bottom surface of each of the cylinder and cone is defined to be at least 0.6 and at most 1. The circularity coefficient is defined by $4\pi \times area/(circumferential\ length)^2$. If the circularity coefficient is less than 0.6, the bottom surface of the cylinder or cone cannot be considered to be a circle. In this case, the figure is not a cylindrical or conical portion. Thus, according to the present invention, the circularity coefficient of at least 0.6 is considered to correspond to a substantial circle. In this case, the circle-equivalent average diameter of the cylindrical or conical portion means the diameter corresponding to the area of the substantial circle converted into a true circle.

The present invention is applicable to light including not only a visible light but also an ultraviolet light. Therefore, the emission wavelength is suitably at least 300 nm and at most 800 nm. The circle-equivalent average diameter of the bottom of the mesa portion 21 is at least 300/(the refractive index of an external medium+the refractive index of the substrate) nm and at most 800 nm.

In the present invention, the surface with the fine concaves and convexes is placed in the outermost layer surface of light radiation side of the semiconductor layer constituting the light emitting element. This is to enable efficiently extracted light radiation from the light emitting element. That is, in the interface between a plurality of substances constituting a light transmission path, the transmission loss of light is large in an interface with a significantly different refractive index (for example, a difference of at least 1.5). Accordingly, fine concaves and convexes are desirably provided on a surface constituting this interface. The interface may be the one between the semiconductor layer constituting the light emitting element and an air layer, or if a protection film such as plastic is formed to protect the light emitting device, the one between the semiconductor layer and the protect film.

Now, description will be given of the period between the convex structures according to the present invention, the dimensions specified for the three portions 21, 22, and 23, and a method for manufacturing the light emitting device.

[Convex Structure Period]

Figure 15:
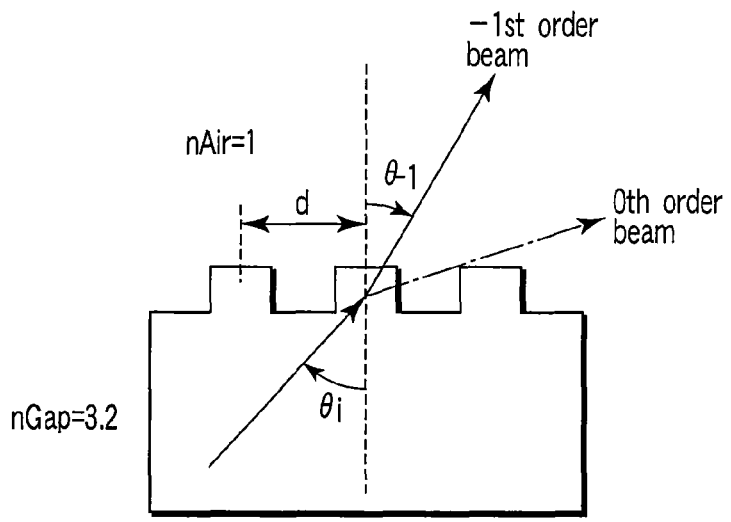
FIG. 15 is a sectional view showing the structure of a convex diffraction grating and illustrating the principle of the present invention.

In regard to the period between the convex structures, when such a diffraction grating as shown in FIG. 15 is assumed, an equation for the diffraction grating based on the scalar theory is given as shown below.

$$n_0 \sin\theta_m - n_{sub}\sin\theta_i = m\frac{\lambda}{d} (m = 0, \pm 1, \pm 2, \sim) \quad (1)$$

In this equation, $n_0$, $n_{sub}$, $\theta_i$, $\theta_m$, $\lambda$, and d denote the refractive index of an external medium, the refractive index of the substrate (set at 3.2), incident angle, exit angle, wavelength, and the period of the diffraction grating. To appear at least a −1st order diffraction, it is necessary that $n_0$ is smaller than $n_{sub}$ (the refractive index of the external medium<the refractive index of the substrate). m is a diffraction order number, and m−1 is related to improvement of light extraction. Here, for simplification, $n_0$=1 (air) and $\lambda$=600 nm are used for calculations. Table 1 shown below shows the results of calculations for the incident angle at which the −1st order light can be diffracted and which is determined from Equation (1).

TABLE 1

| Period d(nm) | 100 | 150 | 200 | 300 | 600 |
|---|---|---|---|---|---|
| Incident angle at which diffraction appears (1st order beam) | None | 69~90° | 39~90° | 18~69° | 0~38° |

Table 1 indicates that diffraction does not appear when the period between the convex structures (grating period) is 100 nm. Thus, only the refractive index gradient effect corresponds to the improvement of light extraction efficiency. For a grating period of 150 or 200 nm, diffraction appears upon a wide angle incidence. For a grating period of 200 nm, diffraction appears over a wide range, that is, at an incidence angle of at least 39°. Thus, with a shallow angle incidence, the refractive index gradient effect improves light extraction efficiency. With a wide angle incidence, the diffraction effect improves light extraction efficiency. Thus, the light extraction efficiency is greatly improved. Equation (1) indicates that if the external medium is air, diffraction appears provided that the grating period is larger than 1/(1+refractive index) of the emission wavelength. A further increase in grating period reduces the −1st order diffraction angle. At 600 nm, which is equivalent to the wavelength, the diffraction angle is smaller, at most 38°. Thus, even when the grating period is 600 nm and is equivalent to the wavelength, light at an angle larger than the total reflection angle (19°) is diffracted. Accordingly, the light extraction efficiency is improved.

If the grating period is longer than the wavelength, 1st-order diffraction angle will be even much smaller. Consequently, the light extraction efficiency will not be improved so much, due to the light-scattering effect. In view of this, it is desired that the periods between the convex structures be equal to or shorter than the wavelength.

[Cylindrical Portion]

The circle-equivalent average diameter of the cylindrical portion 22 is 1/3 to 4/5 of that of the bottom of the mesa portion 21 and is equal to the circle-equivalent average diameter C of the top of the mesa portion 21. Then, no reflection occurs between the mesa portion 21 and the cylindrical portion 22.

In regard to diffraction related to the size and periods of the concaves and convexes, the intensity of scattering (diffraction) is given as shown below if there is a difference (n1 and n0) in the refractive index in a space.

$$I_s = I_e |F(\hbar)|^2 = \int_v \tilde{n}^2 \exp[-i(\hbar \cdot \vec{r}_{kj})] dv_{kj} \quad (2)$$

$$\tilde{n}^2 = V\{n_0^2 + \langle \eta^2 \rangle_{av} r(\vec{r})\} \quad (3)$$

In these equations, Ie is the intensity of an incident light, F is a Thomson facto, V is the volume per unit cell. $\hbar$ and $\vec{r}$ are a wave number and a position vector, respectively, and $\langle \eta^2 \rangle_{av}$ is the average of fluctuations in the refractive index of the space.

$n_0^2$ in Equation (3) has relation only to a very small angle and may be considered to be zero. Accordingly, substituting Equation (3) into Equation (2) results in the following.

$$I_s = I_e V \langle \eta^2 \rangle_{av} \int_v r(\vec{r}) \exp[-i(\hbar \cdot \vec{r}_{kj})] dv \quad (4)$$

The contents of the integration contain factors for the shape and size of the concaves and convexes. Solving the integration indicates what angle results in what exit light. $\langle \eta^2 \rangle_{av}$ is a density factor for the concaves and convexes. When this value is largest, scattering (diffraction) Is is most significant. When the volume fraction of GaP is $\phi_A$ and the volume fraction of the space is $\phi B$, $\langle \eta^2 \rangle_{av}$ is given as follows.

$$\langle \eta^2 \rangle_{av} = \phi_A \eta_A^2 + \phi_B \eta_B^2 = \phi_A \phi_B (n1 - n_0)^2 \quad (5)$$

Thus, Is is largest when $\phi_A = \phi_B = 0.5$.

This indicates that the product of $\phi_A$ and $\phi_B$ determines diffraction efficiency. The maximum value of the circle-equivalent average diameter is about 0.7 times as large as the circle-equivalent average diameter of the bottom of the mesa portion 21. The diffraction effect is weaker as the circle-equivalent average diameter deviates from this value.

Further, if the circle-equivalent average diameter C of the top of the mesa portion 21 is larger than 9/10 of its bottom or smaller than 1/3 of the bottom, the diffraction effect decreases to 1/5 or less of that produced with the optimized period. Thus, the circle-equivalent average diameter of the top is desirably 1/3 to 9/10 of the bottom. This is determined from the theory described below.

As seen in the document (Journal of Optical Society of America, 1385, vol. 72, No. 10, October, 1982), the preferable average height E of the cylindrical portion 22 is estimated to be at least 3/10 of the light wavelength. If the average height E is smaller, almost no diffraction effect is produced. Further, the average height E is desirably equal to or smaller than the light wavelength. If the average height E is larger than the light wavelength, then conversely, diffraction efficiency is degraded.

[Mesa Portion]

In a surface structure that causes light scattering, a larger surface structure more significantly affects light. The effect is proportional to the square of the size. Thus, the circle-equivalent average diameter A of the bottom of the mesa portion 21 is preferably at least 1/20 of wavelength of the light emitted by the light emitting element. A smaller circle-equivalent average diameter A causes a shift from a Rayleigh scattering area, thus rapidly reducing the effects of the concaves and convexes. A more preferable range is at least about 1/10 of the light wavelength. The circle-equivalent average diameter A of the bottom of the mesa portion is set larger than 1/(external refractive index+substrate refractive index), but if the external refractive index is 1.5 and the substrate refractive index is 3.5, then 1/(1.5+3.5)=1/5, this value is within the scattering area. Further, when the circle-equivalent average diameter A is equal to or larger than the light wavelength, light recognizes the shapes of the concaves and convexes themselves, thus reducing the refractive index gradient effect. This is not preferable. Moreover, the circle-equivalent average diameter A is desirably equal to or smaller than the light wavelength at which the light does not recognize the shapes of the concaves and convexes.

The average height D of the mesa portion 21 is preferably at least 1/10 of the light wavelength. A smaller average height D causes the refractive index to vary within a very short distance, thus reducing the refractive index gradient effect. On the other hand, a large average height D precludes a light incident at a wide angle from reaching the cylindrical portion 22. The light is thus reflected and returns to the interior of the substrate. Consequently, the diffraction effect is not produced in the cylindrical portion 22. Thus, the average height D is desirably about at most 1/5 of the light wavelength.

When the circle-equivalent average diameter C of the top of the mesa portion 21 is larger than 9/10 of its bottom, almost no refractive index gradient effect is produced but reflection occurs. On the other hand, if the circle-equivalent average diameter C of the top of the mesa portion 21 is smaller than 1/3 of its bottom, the period of the cylindrical portion 22 becomes excessively large. This weakens the diffraction effect. Thus, the circle-equivalent average diameter C of the top is desirably 1/3 to 9/10 of the bottom.

[Conical Portion]

The circle-equivalent average diameter F of the bottom surface of the conical portion 23 is equal to that of the cylindrical portion 22. This prevents reflection from occurring at the interface between the cylindrical portion 22 and the conical portion 23.

The average height G of the conical portion 23 is preferably at least 1/10 of the light wavelength. A smaller average height G causes the refractive index to vary within a very short distance, thus reducing the refractive index gradient effect. On the other hand, an excessively large average height G reduces the refractive index gradient effect. Thus, the average height G is desirably equal to or smaller than the light wavelength.

(Manufacturing Method)

A normal optical lithography exposure apparatus or an electron beam drawing apparatus can be utilized as a method for producing the above required pattern size. The inventors have developed a method utilizing a micro phase separation structure with a block copolymer (Jpn. Pat. Appln. KOKAI Publication No. 2001-151834). Another method produces polymer beads, silica beads, or the like as a mask (Applied Physics Letter, 2174, vol63, 1993).

The above mask is formed on the uppermost layer of light radiation side of the semiconductor layer constituting the light emitting device or on an inorganic light transmission layer formed on the outermost layer. A cylindrical pattern is formed by reactive ion etching (RIE). Subsequently, the cylindrical pattern is physically etched using a gas such as Ar, The, Ne, Xe, $O_2$, $N_2$, $CF_4$, $CHF_3$, or $SF_4$ which is chemically inactive to the material. When the cylindrical pattern is physically etched, a top surface of the cylinder and a substrate surface other than the cylinder are etched. A mesa portion and a conical portion are self-formed. The above three structure portions can be produced by employing such a two-stage etching method.

The details of the present invention will be described below.

[Configuration of Light Emitting Element]

The light emitting element according to the present invention is a semiconductor light emitting element such as a light emitting diode (LED) or a semiconductor laser (LD).

Figure 3:
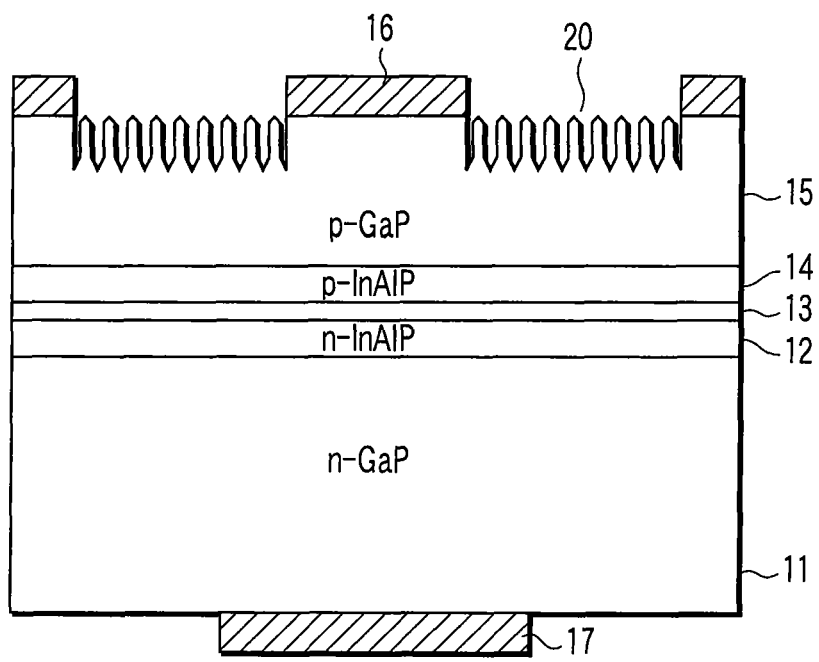
FIG. 3 is a sectional view showing the element structure of a light emitting diode according to an embodiment of the present invention.

FIG. 3 is shown the element structure of a light emitting diode according to an embodiment of the present invention.

In the figure, reference numeral 11 denotes an n-type GaP substrate. A hetero structure portion is formed on the substrate 11; the hetero structure portion includes an n-type InAlP clad layer 12, an InGaP active layer 13, and a p-type InAlP clad layer 14. A p-type GaP current diffusion layer 15 is formed on the hetero structure portion. A p-side electrode 16 is formed on a part of the current diffusion portion 15. An n-side electrode 17 is formed on a back surface of the substrate 11. A beam emitted by the active layer 13 is picked up from the surface of the current diffusion layer 15 on which the electrode 16 is not formed.

Figure 4:
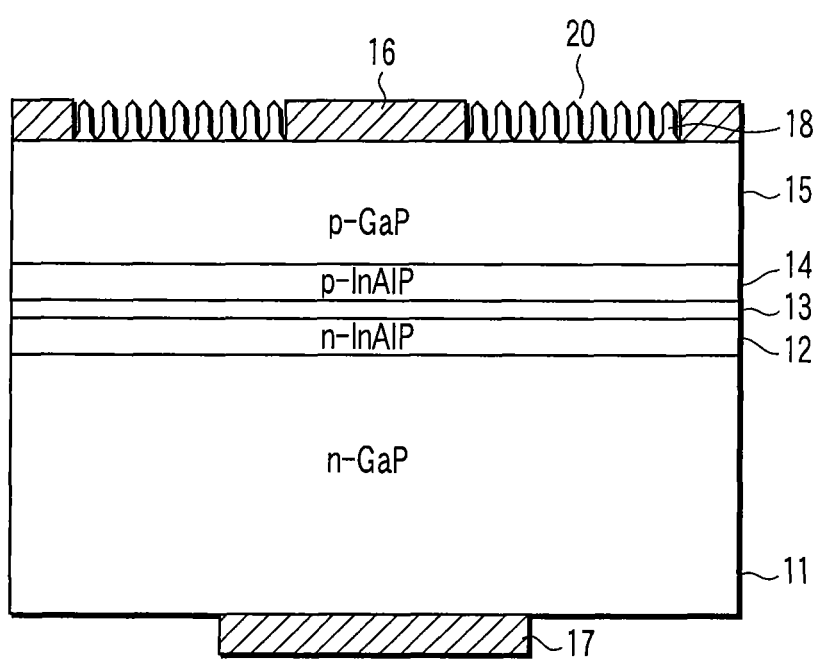
FIG. 4 is a sectional view showing the element structure of a light emitting diode according to another embodiment of the present invention.

The basic configuration described above is substantially the same as that of the conventional element. In addition, in the present embodiment, fine concaves and convexes are formed on the exposed surface of the current diffusion layer 15 on which no electrode is formed. The concaves and convexes on this surface constitute a surface with the convex structures 20. Further, as shown in FIG. 4, an inorganic light transmission layer 18 is formed on the exposed surface of the current diffusion layer 15 on which no electrode is formed; the inorganic light transmission layer 18 has a refractive index equivalent to that of the layer 15. Fine concaves and convexes may then be formed on a front surface of the inorganic light transmission layer 18. The fine concaves and convexes are preferably formed directly on the exposed surface of the current diffusion layer 15 on which the electrode is not formed because this process is easy and accomplishes high light extraction efficiency.

[Method for Manufacturing Light Emitting Element]

Now, description will be given of a method for manufacturing such a light emitting element.

First, description will be given of a method utilizing a micro phase separation structure with a block copolymer, the method having been developed by the inventors (Jpn. Pat. Appln. KOKAI Publication No. 2001-151834).

Figure 5A:
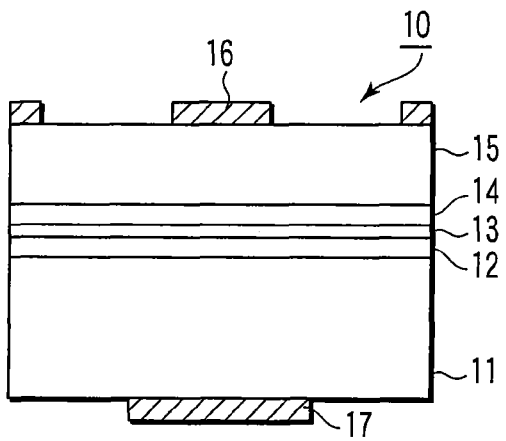
FIGS. 5A to 5E are sectional views showing a process for manufacturing the light emitting diode in FIG. 3 (utilizing a micro phase separation structure with a block copolymer)

First, as shown in FIG. 5(a), a double hetero structure portion is formed on the n-GaP substrate 11; the double hetero structure portion has the active layer 13 sandwiched between the clad layers 12 and 14. Subsequently, the current diffusion layer 15 is epitaxially grown on the double hetero structure portion. The p-side electrode 16 is formed on part of the current diffusion layer 15. The n-side electrode 17 is formed on the back surface of the substrate 11. The above process is the same as that according to the conventional art.

Figure 5B:
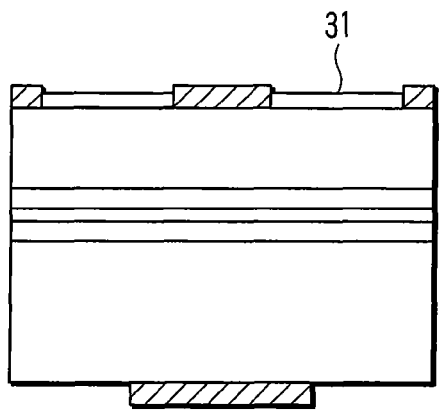

Then, as shown in FIG. 5(b), a solution is coated on the light emitting element substrate 10 configured as shown in FIG. 5(a); the solution consists of a block copolymer which is a micro phase separation structure composition and which is dissolved into a solvent. The substrate is then pre-baked to vaporize the solvent to form a mask material layer 31. Subsequently, the block copolymer film is annealed in a nitrogen atmosphere to separate the block copolymer into phases.

Figure 5C:
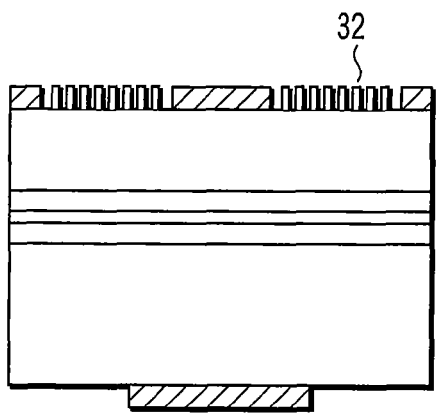

Then, the block copolymer substrate separated into the phases is dry etched by RIE in the presence of an etching gas to etch the block copolymer in the film separated into the phases. On this occasion, owing to a difference in etching rate among a plurality of polymer fragments constituting the block copolymer, any of the phases of the block copolymer fragments is selectively etched. Consequently, as shown in FIG. 5(c), a fine pattern 32 remains.

Figure 5D:
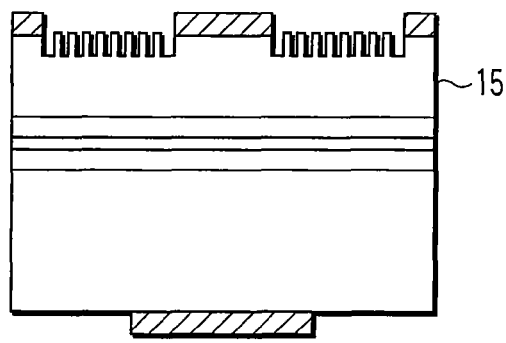

Then, as shown in FIG. 5(d), the substrate is dry etched by RIE using a required etching gas and also using, as a mask, the polymer fragment pattern 32, which has remained without being etched off. This forms a fine concave and convex pattern on the front surface of the current diffusion layer 15. The gas used is not only limited to $Cl_2$ but etching can also be accomplished by adding $BCL_3$ or $N_2$ to the gas. Subsequently, an $O_2$ asher is used to remove the remaining polymer fragment to form a cylindrical concave and convex pattern.

Figure 2:
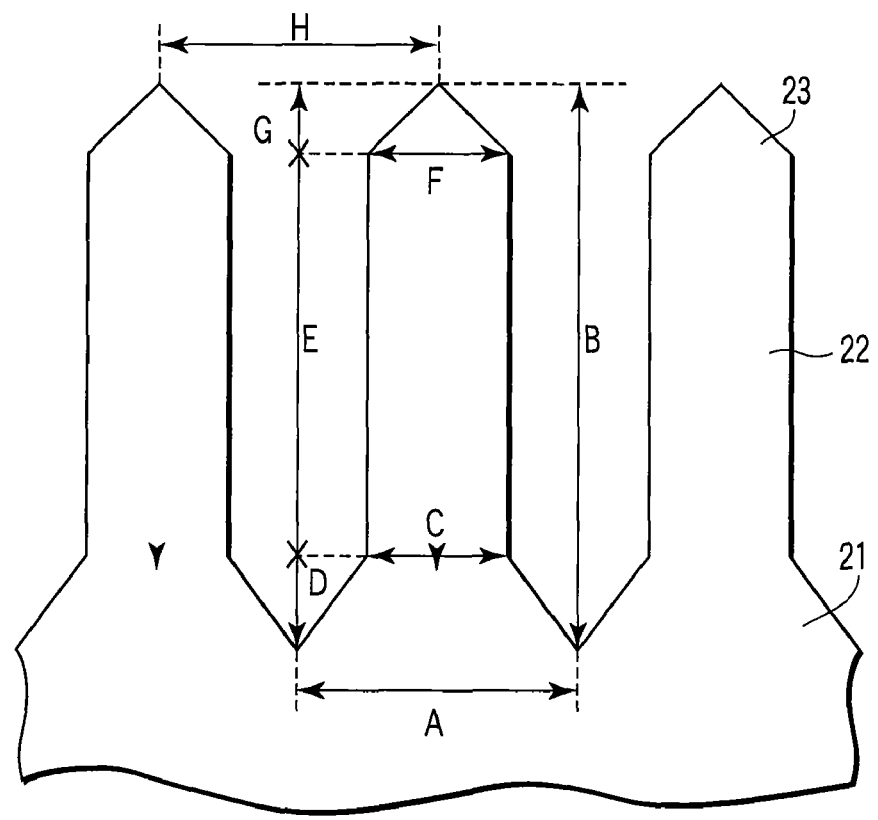
FIG. 2 is an enlarged diagram showing convex structures in FIG. 1.
Figure 5E:
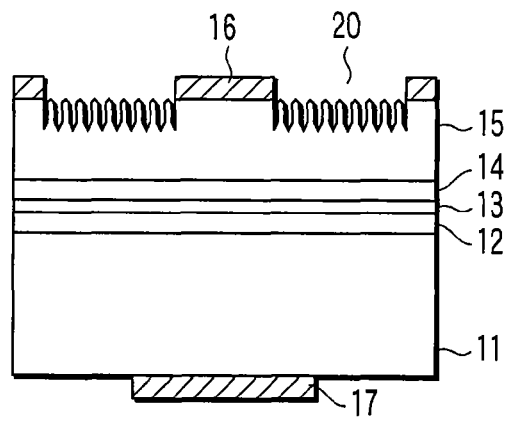

Then, the cylindrical concave and convex pattern is sputtered by an inert gas, for example, an Ar or He gas, to sputter-etch the upper and the bottom of the cylinder as shown in FIG. 5(e). As a result, the convex structures 20 are obtained each of which has a conical portion, a cylindrical portion, and a mesa portion as shown in FIGS. 1 and 2.

Further, description will be given of a method for manufacturing a light emitting element using PS fine spheres as polymer beads.

Figure 6A:
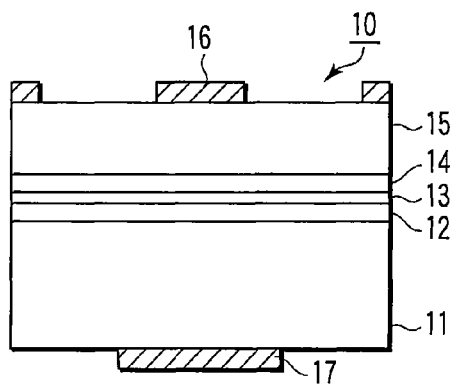
FIGS. 6A to 6D are sectional views showing a process for manufacturing the light emitting diode in FIG. 3 (utilizing PS fine spheres)
Figure 6B:
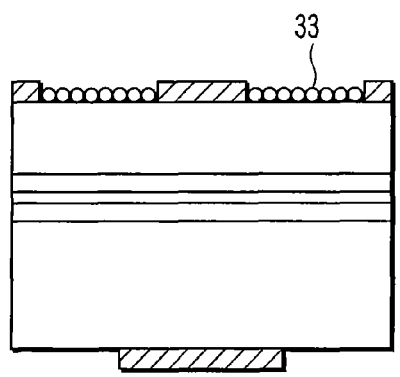

As shown in FIG. 6(a), the light emitting element substrate 1 is the same as that shown in FIG. 5(a). The light emitting element substrate 10 configured as shown in FIG. 6(a) is immersed into a water solution in which PS spheres of diameter 200 nm are dispersed. Subsequently, the substrate 10 is gradually lifted. During the lifting, owing to the presence of an interface between the substrate surface and the surface of the water solution and the air, that is, what is called a meniscus line, the PS spheres are attracted to the substrate surface along the meniscus line. Consequently, the PS spheres are configured on the substrate surface as a monolayer. As a result, a pattern 33 of the PS spheres is formed as shown in FIG. 6(b).

Figure 6C:
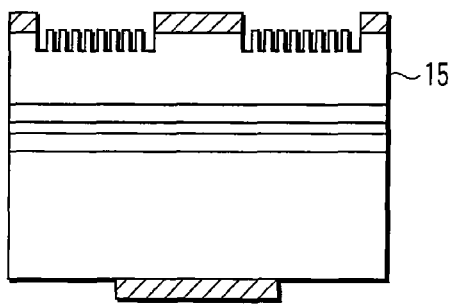
Figure 6D:
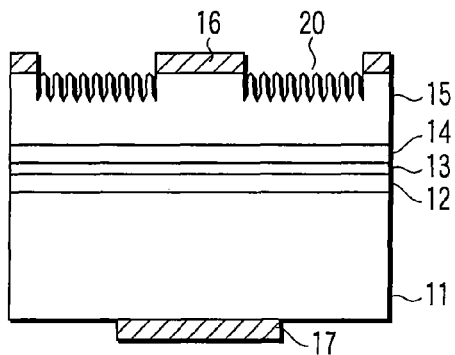

Then, as shown in FIG. 6(c), using the PS spheres pattern 33, the substrate is dry etched by RIE at a required etching gas. A fine concave and convex pattern is then formed on the front surface of the current diffusion layer 15. Then, the $O_2$ asher is used to remove the remaining PS fine spheres to form a cylindrical concave and convex pattern. Subsequently, as shown in FIG. 6(d), the cylindrical concave and convex pattern is sputtered by an inert gas to sputter-etch the top and the bottom of the cylinder. As a result, the convex structures 20 are obtained each of which has a conical portion, a cylindrical portion, and a mesa portion as shown in FIGS. 1 and 2.

Further, description will be given of a method for manufacturing a light emitting element using electron beam drawing.

Figure 7A:
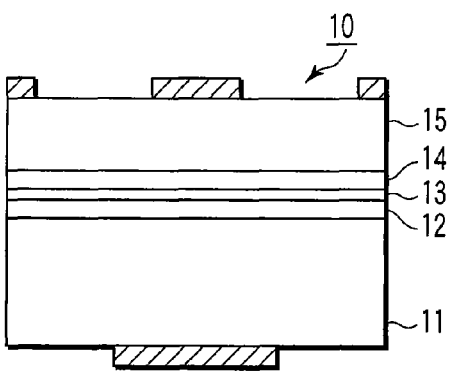
FIGS. 7A to 7D are sectional views showing a process for manufacturing the light emitting diode in FIG. 3 (utilizing electron beam drawing)
Figure 7B:
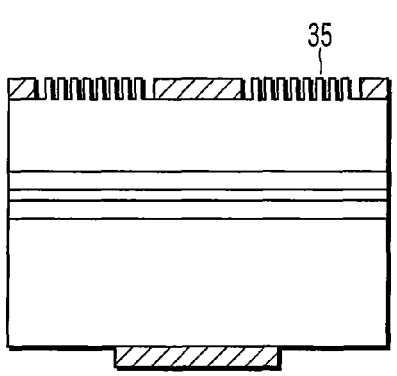
Figure 7C:
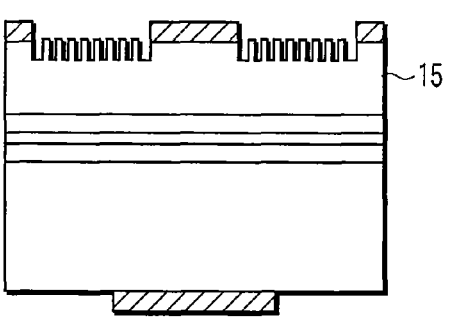
Figure 7D:
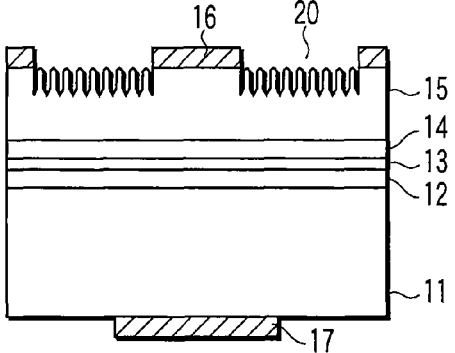

As shown in FIG. 7(a), the light emitting substrate 10 is the same as that shown in FIG. 5(a). With this method, first, as shown in FIG. 7(b), an electron beam resist is formed on the light emitting element substrate 10. Then, a resist pattern 35 is generated using an electron beam exposure apparatus equipped with a pattern generator and having an acceleration voltage of 50 kV; circular patterns of diameter 150 nm are arranged in the resist pattern 35. Then, as shown in FIG. 7(c), Using the resist pattern, the substrate was dry etched by ICP at a required etching gas. A fine concave and convex pattern is then formed on the front surface of the current diffusion layer 15. Then, the $O_2$ asher is used to remove the remaining PS fine spheres to form a cylindrical concave and convex pattern. Subsequently, as shown in FIG. 7(d), the cylindrical concave and convex pattern is sputtered by an inert gas to sputter-etch the top and the bottom of the cylinder. As a result, the convex structures 20 are obtained each of which has a conical portion, a cylindrical portion, and a mesa portion as shown in FIGS. 1 and 2.

With the present method, exactly the same results are obtained by an optical lithography method using as a light source an excimer laser such as $F_2$, ArF, or KrF or an emission line from a mercury lamp such as an i line or a g line, instead of electron light.

The present invention is not limited to the above methods, but a detailed description will be given of the etching method utilizing the micro phase separation structure of the block copolymer.

[Micro Phase Separation Structure Shaping Resin Composition]

A thin film of a block copolymer or graft copolymer is formed and then subjected to micro phase separation (phase separation in block copolymer molecules). Then, one polymer phase is selectively removed to form a porous film having a nanometer size pattern. The porous film obtained can be used as a mask for pattern transfer by etching the foundation of the film. One polymer phase is selectively removed from the micro phase separation structure by utilizing a difference in dry etching rate between two polymer phases, a difference in decomposability with respect to energy lines, or a difference in pyrolysis. None of these methods require the use of the lithography technique. This has high throughput and reduces costs.

[Formation of Micro Phase Separation Structure Shaping Resin Composition Thin Film]

To form a thin film of a micro phase structure shaping resin composition, it is preferable to apply a uniform solution of the resin composition to the surface of the light emitting element. The use of the uniform solution prevents a history of film formation from remaining. If for example, micells of a relatively large spheresize are generated in the solution to make the coated liquid nonuniform, an irregular phase separation structure is mixed to make the formation of a regular pattern difficult. Thus, a long time is required to form a regular pattern. This is not preferable.

A solvent into which the block copolymer, the micro phase structure shaping resin component, is dissolved desirably exhibits a high dissolubility for the two types of polymers constituting the block copolymer. The repulsion between polymer chains is in proportion to the square of a difference in dissolubility between the two types of polymer chains. Thus, the use of a solvent exhibiting a high dissolubility for the two types of polymers reduces the difference in dissolubility parameter between the two types of polymers, thus reducing the free energy of the system. This is advantageous to phase separation.

To produce a thin film of a block copolymer, it is preferable to use a solvent such as ethyl cellosolve acetate (ECA), propylene glycol monomethyl acetate (PGMEA), or ethyl lactate (EL) which has a high boiling point equal to or higher than 150° C.

The film thickness of the micro phase separation structure shaping composition thin film formed is preferably equivalent to or three times as large as the circle-equivalent average diameter of the target surface concaves and convexes.

[Formation of Micro Phase Separation Structure]

The method described below can be used to produce a micro phase separation structure of a block or graft copolymer. For example, a block or graft copolymer is dissolved into an appropriate solvent to prepare a coating solution. The coating solution is coated on the substrate, which is then dried to form a film. Then, a good phase separation structure can be formed by annealing this film at a temperature equal to or higher than the glass transition temperature of the polymer. The following method is also possible. The copolymer is melted and then annealed at a temperature equal to or higher than the glass transition temperature and equal to or lower than the phase transition temperature for micro phase separation. The micro phase separation structure is then immobilized at room temperature. The micro phase separation structure can also be formed by casting a solution of the copolymer slowly. The micro phase separation structure can also be formed by melting the copolymer, molding it into a desired shape using a hot press method, an injection method, a transfer molding method, or the like, and then annealing the copolymer.

Jpn. Pat. Appln. KOKAI Publication No. 2001-151834 describes in detail means for forming a nanometer size structure utilizing the micro phase separation structure thus formed. The present invention may utilize this means.

A pattern transfer method is also effective. This means is described in Jpn. Pat. Appln. KOKAI Publication No. 2001-151834 in detail and the present invention may utilize it. Specifically, on a substrate of the compound semiconductor, a layer (pattern transfer layer) with a different etching resistance is coated. A block copolymer layer according to the present invention is further coated on the pattern transfer layer. In this case, the pattern transfer layer may be composed of SOG (Spin On Glass) or any of the materials shown in Jpn. Pat. Appln. KOKAI Publication No. 2001-151834.

The block copolymer layer is dry- or wet-etched to selectively remove only one phase of the block copolymer. A concave and convex pattern is thus formed. Then, the pattern transfer layer is etched using the pattern of the polymer, which is organic matter, as a mask. The use of a fluorine-, chlorine-, or bromine-based gas enables the pattern transfer layer such as SOG to be etched using the organic matter as a mask.

In this manner, the micro phase separating pattern of the block copolymer can be transferred to the pattern transfer layer. Then, the substrate is etched using as a mask the pattern transfer layer to which the pattern has been transferred.

This method is effective on etching of, for example, a compound containing a metal that cannot provide an etching selection ratio for a carbon-based polymer material. Alternatively, the use of a plurality of pattern transfer layers makes it possible to stack materials with different etching resistances to obtain a pattern with a high aspect ratio.

EXAMPLES

Now, the present invention will be described with reference to the following examples. Examples 1 to 17 describe a method for producing concaves and convexes using a micro phase separation structure of a block copolymer. Examples 18 to 21 describe a method for producing concaves and convexes using PS or silica spheres. Example 22 describes a method for producing concaves and convexes using electron beam drawing.

Example 1

FIG. 3 is a sectional view showing the element structure of a light emitting diode according to a first example of the present invention.

A double hetero structure is formed on the n-GaP substrate 11; the double hetero structure has the InGaAlP active layer 13 sandwiched between the n-InAlP clad layer 12 and the p-InAlP clad layer 14. The GaP current diffusion layer 15 is formed on the double hetero structure. The p-side electrode 16 is formed on a part of the p-GaP current diffusion layer 15. The n-side electrode 17 is formed on a part of the bottom surface of the n-GaP substrate 11. Thus, a light emitting diode of emitting wavelength 650 nm is formed.

In this case, instead of GaP, GaAs may be used as the substrate 11. Instead of GaP, InAlP or InGaAlP may be used as the current diffusion layer 15. Of course, the substrate may be of the p type and the entire conductivity type may be reversed.

The convex structures 20, characteristic of the present example, are formed on the part of surface of the current diffusion layer 15 on which the electrode 16 is not formed. As shown in FIGS. 1 and 2, the convex structure 20 has three portions, the mesa portion 21 constituting a refractive index gradient structure, the cylindrical portion 22 constituting a diffractive grating structure, and the conical portion 23 constituting a refractive index gradient structure. The circle-equivalent average diameter of the bottom side of the concaves and convexes is 160 nm; the bottom side corresponds to the bottom of the mesa portion 21. The circle-equivalent average diameter of the top of the mesa portion 21 is 100 nm. The average height of the mesa portion 21 is 80 nm. The circle-equivalent average diameter of the bottom and the top of the cylindrical portion 22 is 80 nm and is the same as that of the bottom of the mesa portion 21. The average height of the cylindrical portion 22 is 250 nm. The circle-equivalent average diameter of the bottom of the conical portion 23 is 80 nm and is the same as that of the bottom of the mesa portion 21. The average height of the conical portion 23 is 80 nm. The period between the convex structures is 180 nm.

Now, description will be given of a method for manufacturing a light emitting diode according to the present example.

First, as shown in FIG. 5(a), the n-InAlP clad layer 12, InGaAlP active layer 13, p-InAlP clad layer 14, and p-GaP current diffusion layer 15 are continuously grown and formed on the n-GaP substrate 11 by an organic metal chemical vapor phase growth method (MOCVD method). Subsequently, the p-side electrode 16 is formed on the current diffusion layer 15. The n-side electrode 17 is formed on the back surface of the substrate 11. The electrodes 16 and 16 are machined into desired patterns. Thus, the light emitting element substrate 10 is produced.

Then, as shown in FIG. 5(b), a solution is coated on the light emitting element substrate 10 by spin coating at a rotation speed of 2,500 rpm; the solution contains a block copolymer dissolved into a solvent. The light emitting element substrate 10 is then pre-baked at 110° C. for 90 seconds to vaporize the solvent. This forms a block copolymer layer 31 on a part of surface of the current diffusion layer 15 on which the electrode 16 is not formed. The block copolymer 31 is composed of polystyrene (PS) and poly methyl methacrylate (PMMA). PS has a molecular weight of 154,800 and PMMA has a molecular weight of 382,300 and Mw/Mn of 1.08. Subsequently, a block copolymer film 31 is annealed at 210° C. in a nitrogen atmosphere for four hours to separate PS from PMMA. Then, the phase-separated substrate with the block copolymer was dry etched by RIE at a CF4 flow rate of 30 sccm, a pressure of 1.33 Pa (10 mTorr), and a power of 100 W to etch PS and PMMA, separated from each other in the film. In this case, PMMA is selectively etched owing to a difference in etching rate between PS and PMMA to leave the PS pattern 32 as shown in FIG. 5(c).

Then, as shown in FIG. 5(d), using the PS pattern 32 as a mask, the current diffusion layer 15 was dry etched by RIE at a $Cl_2$ flow rate of 50 sccm, a pressure of 0.266 Pa (2 mTorr), and a power of 300 W for about 60 seconds to form a fine cylindrical pattern. The etching gas is not only limited to $Cl_2$ but etching can be accomplished by adding $BCl_3$ to the gas. Subsequently, the $O_2$ asher was used to remove the remaining PS.

Then, as shown in FIG. 5(e), the cylindrical pattern was sputtered by Ar gas at an Ar flow rate of 50 sccm, a pressure of 0.65 Pa (5 mTorr), and a power of 300 W for 60 seconds. Thus, the bottom side and the top of the cylinder were sputtered to form a mesa portion and a conical portion.

As a result, a fine concave and convex pattern with the conical, cylindrical, and mesa portions could be formed on a part of surface of the substrate of the compound semiconductor on which electrodes and wiring patterns were not formed. On this occasion, the average diameter of the bottom of the mesa portion was 160 nm. The average diameter of the top of the mesa portion was 100 nm. The average height of the mesa portion was 70 nm. The average diameter of the cylindrical portion was 100 nm. The average height of the cylindrical portion was 250 nm. The average diameter of the conical portion was 100 nm. The average height of the conical portion was 80 nm. The period between the convex structures was 180 nm.

A light emitting diode having its concave and convex surface was made a tip. The luminescence of a light emitting diode tip having its concave and convex surface increased 30% compared with that of a light emitting diode tip not having its concave and convex surface.

Thus, according to the present example, the appropriate concave and convex structures are formed on the light extraction surface of the light emitting element. This makes it possible to efficiently extract light generated inside the device to improve luminescent efficiency. Moreover, the light emitting element can be produced with low manufacturing costs and a high productivity.

Example 2

A phase-separated substrate with a block copolymer produced as described in Example 1 was dry etched by RIE at an $O_2$ flow rate of 30 sccm, a pressure of 13.3 Pa (100 mTorr), and a power of 100 W to etch PS and PMMA, separated from each other. $O_2$ etching cannot etch the substrate in contrast to $CF_4$ etching but can selectively etch PMMA. Subsequently, by a process similar to that in Example 1 fine concaves and convexes having conical, cylindrical, and mesa portions was formed.

On this occasion, the average diameter of the bottom of the mesa portion 21 was 160 nm. The average diameter of the top of the mesa portion 21 was 100 nm. The average height of the mesa portion 21 was 70 nm. The average diameter of the cylindrical portion 22 was 100 nm. The average height of the cylindrical portion 22 was 250 nm. The average diameter of the conical portion 23 was 100 nm. The average height of the conical portion 23 was 80 nm. The period between the convex structures was 180 nm.

A light emitting diode having its concave and convex surface was made a tip. The luminescence of a light emitting diode tip having its concave and convex surface increased 30% compared with that of a light emitting diode tip not having its concave and convex surface.

Example 3

The spin coat method was used to coat a solution, at 3,000 rpm, on the current diffusion layer 15, the uppermost layer of the light emitting element formation substrate 10, used in Example 1; the solution was obtained by dissolving a block copolymer containing PS of molecular weight 315,000 and PMMA of molecular weight 785,000. Subsequently, the light emitting element substrate 10 was pre-baked at 110° C. for 90 seconds to vaporize the solvent. A thickness of 150 nm was thus obtained. Then, in a nitrogen atmosphere, the block copolymer film was annealed at 210° C. for four hours to separate PS from PMMA. A PS dot pattern of diameter about 110 nm was formed.

The phase-separated GaP substrate with the block copolymer was dry etched by RIE at an $O_2$ flow rate of 30 sccm, a pressure of 13.3 Pa (100 mTorr), and a power of 100 W to etch PS and PMMA, separated from each other. $O_2$ etching cannot etch the substrate but can selectively etch PMMA. Since the etching rate ratio of PS to PMMA is 1:4, PMMA was selectively etched with the PS pattern remaining. The PS pattern had a thickness of about 130 nm.

Then, using the PS pattern as a mask, the GaP substrate was dry etched by inductive coupled plasma (ICP) at $BCl_3$/$Cl_2$=5/20 sccm, 0.266 Pa (2 mTorr), and incident power/bias power=100/100 W for 150 seconds. Thus, a fine cylindrical pattern of diameter 100 nm and height 450 nm was formed. Subsequently, the $O_2$ asher was used to remove the remaining PS. Then, the cylindrical pattern was sputtered by Ar gas in the same manner as in Example 1 to form fine concaves and convexes having conical, cylindrical, and mesa portions.

As a result, the fine concaves and convexes having conical, cylindrical, and mesa portions were formed on the front surface of the GaP emission layer; the conical, cylindrical, and mesa portions had the following dimensions. The average diameter of the bottom of the mesa portion 21 was 170 nm. The average diameter of the top of the mesa portion 21 was 110 nm. The average height of the mesa portion 21 was 80 nm. The average diameter of the cylindrical portion 22 was 110 nm. The average height of the cylindrical portion 22 was 350 nm. The average diameter of the conical portion 23 was 110 nm. The average height of the conical portion 23 was 120 nm. The period between the convex structures was 180 nm.

A light emitting diode having its concave and convex surface was made a tip. The luminescence of a light emitting diode tip having its concave and convex surface increased 60% compared with that of a light emitting diode tip not having its concave and convex surface.

Example 4

A phase-separated substrate with a block copolymer produced as described in Example 3 was dry etched by RIE at $BCl_3$/$Cl_2$=5/20 sccm, 0.266 Pa (2 mTorr), and incident power/bias power=100/100 W to etch PS and PMMA, separated from each other. Since the etching rate ratio of PS to PMMA is 1:4, PMMA was selectively etched with the PS pattern remaining. Then, the cylindrical pattern was sputtered by Ar gas in the same manner as in Example 1 to form fine concaves and convexes having conical, cylindrical, and mesa portions.

As a result, the fine concaves and convexes having conical, cylindrical, and mesa portions were formed on the front surface of the compound semiconductor light emitting layer; the conical, cylindrical, and mesa portions had the following dimensions. The average diameter of the bottom of the mesa portion 21 was 160 nm. The average diameter of the top of the mesa portion 21 was 100 nm. The average height of the mesa portion 21 was 100 nm. The average diameter of the cylindrical portion 22 was 100 nm. The average height of the cylindrical portion 22 was 300 nm. The average diameter of the conical portion 23 was 100 nm. The average height of the conical portion 23 was 120 nm. The period between the convex structures was 180 nm. With this process, RIE by $BCl_3$/$Cl_2$ enabled all of PMMA to be removed at a time to form concaves and convexes on the front surface of the compound semiconductor light emitting layer.

A light emitting diode having its concave and convex surface was made a tip. The luminescence of a light emitting diode tip having its concave and convex surface increased 55% compared with that of a light emitting diode tip not having its concave and convex surface.

Example 5

Polystyrene (PS)-polyisoprene (PI) was used as a block copolymer. The molecular weight of PS was 450,000, the molecular weight of PI was 1,230,000, and Mw/Mn was 1.07. A phase-separated substrate with a block copolymer was produced as described in Example 3. The PS-PI block copolymer was subjected to phase separation using ozone to selectively oxidize and remove PI.

Using the PS pattern as a mask, the GaP substrate was dry etched by ICP at $BCl_3$/$Cl_2$=5/20 sccm, 0.266 Pa (2 mTorr), and incident power/bias power=100/100 W for 160 seconds. A cylindrical pattern was formed. Subsequently, the $O_2$ asher was used to remove the remaining PS. Then, the cylindrical pattern was sputtered by Ar gas in the same manner as in Example 1 to form fine concaves and convexes having conical, cylindrical, and mesa portions.

As a result, the fine concaves and convexes having the conical, cylindrical, and mesa portions were formed on the front surface of the GaP emission layer; the conical, cylindrical, and mesa portions had the following dimensions. The average diameter of the bottom of the mesa portion 21 was 170 nm. The average diameter of the top of the mesa portion 21 was 100 nm. The average height of the mesa portion 21 was 100 nm. The average diameter of the cylindrical portion 22 was 100 nm. The average height of the cylindrical portion 22 was 400 nm. The average diameter of the conical portion 23 was 100 nm. The average height of the conical portion 23 was 120 nm. The period between the convex structures was 180 nm.

A light emitting diode having its concave and convex surface was made a tip. The luminescence of a light emitting diode tip having its concave and convex surface increased 80% compared with that of a light emitting diode tip not having its concave and convex surface.

In connection with the method according to the present example, since a PI monomer does not readily absorb water, a substance with a higher molecular weight is polymerized more easily than PMMA during polymerization. This facilitates an increase in the size of the pattern. The present method requires the film to have a thickness equivalent to that of the pattern produced by the block copolymer. Thus, a large pattern enables an increase in the height of the pattern transferred to the compound semiconductor. In addition, almost the same structure was obtained using polybutadiene (PB) in place of PI.

Example 6

FIG. 8 is shown a process for manufacturing a light emitting diode according to a sixth embodiment of the present invention. In the figure, the same components as those shown in FIG. 5 have the same reference numerals. A detailed description of these components is omitted.

Figure 8A:
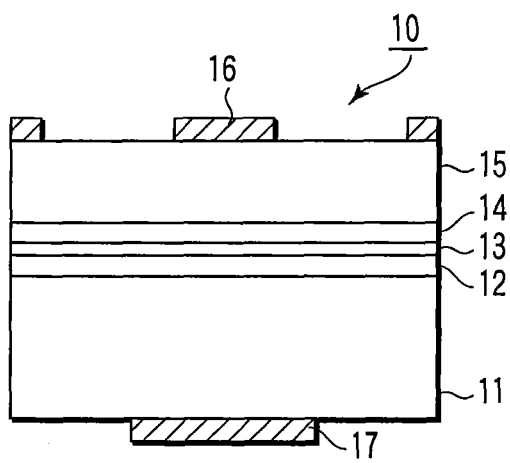
FIGS. 8A to 8E are sectional views showing a process for manufacturing a light emitting diode according to a sixth example.

As shown in FIG. 8(a), the light emitting substrate 10 was prepared, which had a structure similar to that of Example 1. The uppermost current diffusion layer 15 was InGaAlP.

Figure 8B:
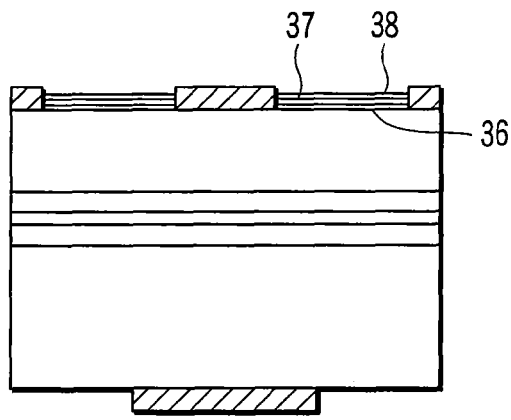

Then, as shown in FIG. 8(b), a resist 36 (ARCXHRiC-11 manufactured by NISSAN CHEMICAL INDUSTRIES, LTD) was spin-coated to form a film of thickness 500 nm. The substrate was then baked in an oven at 300° C. for one minute. Subsequently, spin-on-glass (SOG) 37 (OCD T-7 manufactured by TOKYO OHKA KOGYO CO., LTD) was spin-coated on the resist 36 to a thickness of 110 nm. The substrate was then baked on a hot plate at 200° C. for 60 seconds and then at 300° C. for 60 seconds. Moreover, a solution 38 was coated on the substrate by spin coating at 2,500 rpm; the solution 38 was obtained by dissolving, into a solvent, the same block copolymer as that used in Example 3. The substrate was then pre-baked at 110° C. for 90 seconds to vaporize the solvent. Then, the block copolymer film was annealed in a nitrogen atmosphere at 210° C. for four hours to separate PS from PMMA in the block copolymer.

Figure 8C:
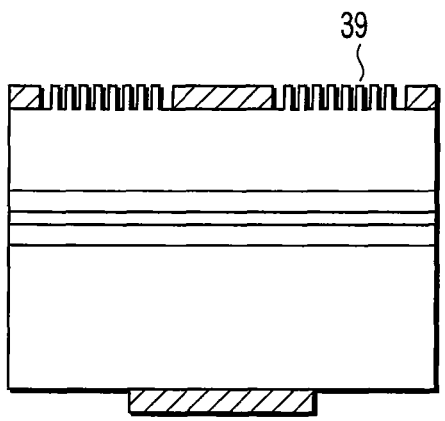

The phase-separated substrate with the block copolymer was dry etched by RIE at an $O_2$ flow rate of 30 sccm, a pressure of 13.3 Pa (100 mTorr), and a power of 100 W to etch PS and PMMA, separated from each other. On this occasion, owing to the difference in etching speed between PS and PMMA, PMMA was selectively etched with the PS pattern remaining. Using the PS pattern as a mask, the SOG was dry etched by CF4 RIE at a CF4 flow rate of 30 sccm, a pressure of 1.33 Pa (10 mTorr), and a power of 100 W. Moreover, the lower resist layer was dry etched by O2 RIE at an $O_2$ flow rate of 30 sccm, a pressure of 1.33 Pa (10 mTorr), and a power of 100 W. Thus, a columnar pattern of height 500 nm was obtained. Such a mask pattern 39 as shown in FIG. 8(c) was formed.

Figure 8D:
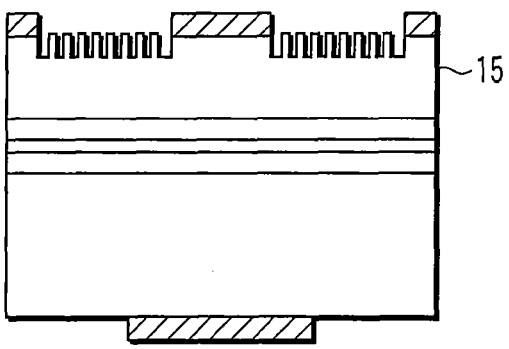

Then, as shown in FIG. 8(d), the current diffusion layer 15 was dry etched at $BCl_3/N_2$=23/7 sccm, 0.200 Pa (1.5 mTorr), and a power of 500 W. Finally, the $O_2$ asher was used to remove the remaining polymer. SOG had already been removed by the preceding $BCl_3/N_2$ etching.

Figure 8E:
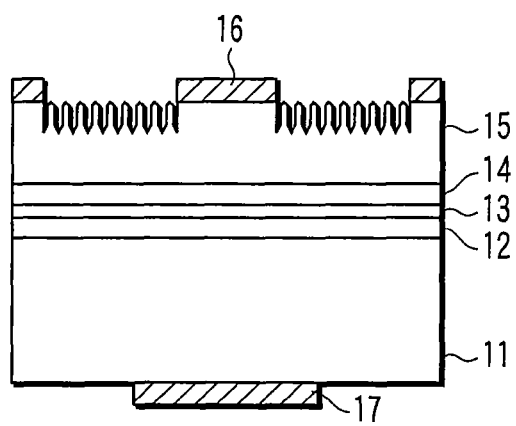

Subsequently, the cylindrical pattern was sputtered by Ar gas in the same manner as in Example 1 to form fine concaves and convexes having conical, cylindrical, and mesa portions as shown in FIG. 8(e).

As a result, the etching of InGaAlP could be achieved which is difficult to etch by a common etching method. As a result of etching, fine concaves and convexes having a conical, cylindrical, and mesa portions could be formed; the conical, cylindrical, and mesa portions had the following shape. The average diameter of the bottom of the mesa portion 21 was 170 nm. The average diameter of the top of the mesa portion 21 was 110 nm. The average height of the mesa portion 21 was 150 nm.

The average diameter of the cylindrical portion 22 was 110 nm. The average height of the cylindrical portion 22 was 350 nm. The average diameter of the conical portion 23 was 110 nm. The average height of the conical portion 23 was 100 nm. The period between the convex structures was 200 nm.

Example 7

FIG. 9 is shown a process for manufacturing a light emitting diode according to a seventh embodiment of the present invention. In the figure, the same components as those shown in FIG. 5 have the same reference numerals. A detailed description of these components is omitted.

As shown in FIG. 9(a), the light emitting substrate 10 was prepared, which had a structure similar to that of Example 1. Then, as shown in FIG. 9(b), block copolymers 41 and 41' were formed on the front surface of the p-GaP current diffusion layer 15 and on the back surface of the n-GaP substrate 11, respectively, both surfaces being light extracted surfaces.

Then, as shown in FIG. 9(c), the block copolymer film was annealed in a nitrogen atmosphere at 210° C. for four hours to separate PS from PMMA. A PS dot pattern of diameter about 110 nm was formed. Subsequently, the phase-separated substrate with the block copolymer was dry etched by RIE at an $O_2$ flow rate of 30 sccm, a pressure of 13.3 Pa (100 mTorr), and a power of 100 W to etch PS and PMMA, separated from each other. PMMA was selectively etched with the PS pattern remaining. The opposite surfaces both had a thickness of about 130 nm.

Then, as shown in FIG. 9(d), using the PS pattern as a mask, both the p-GaP and n-GaP surfaces were dry etched by ICP at $BCl_3/Cl_2$=5/20 sccm, 0.266 Pa (2 mTorr), and incident power/bias power=100/100 W for 150 seconds. As a result, a fine cylindrical pattern of diameter 100 nm and height 450 nm was formed on the p-GaP and n-GaP surfaces. Subsequently, the $O_2$ asher was used to remove the remaining PS.

Then, as shown in FIG. 9(e), the opposite surfaces are sputtered by Ar as in the case Example 1 to form, on the opposite surface, fine concaves and convexes having conical, cylindrical, and mesa portions.

As a result, the fine concaves and convexes having the conical, cylindrical, and mesa portions could be formed on each of the p-GaP and n-GaP light extracted surfaces. The average diameter of the bottom of the mesa portion 21 was 180 nm. The average diameter of the top of the mesa portion 21 was 100 nm. The average height of the mesa portion 21 was 80 nm. The average diameter of the cylindrical portion 22 was 100 nm. The average height of the cylindrical portion 22 was 350 nm. The average diameter of the conical portion 23 was 100 nm. The average height of the conical portion 23 was 120 nm. The period between the convex structures was 180 nm.

A light emitting diode having its concave and convex surface was made a tip. The luminescence of a light emitting diode tip having its concave and convex surface increased 100% compared with that of a light emitting diode tip not having its concave and convex surface. Further, the light emitting diode according to the present embodiment emits light not only from the front surface but also from the back surface. Accordingly, a significant improvement in luminance was obtained by forming concaves and convexes on the back surface.

Example 8

Spin-on-glass (SOG) (OCD T-7 manufactured by TOKYO OHKA KOGYO CO., LTD) was spin-coated on the light emitting element substrate 10 to a thickness of 110 nm; the light emitting element substrate 10 has InGaAlP deposited on the light extracted surface and which has a structure similar to that in Example 6. The substrate was then baked on the hot plate at 200° C. for 60 seconds and then at 300° C. for 60 seconds. Moreover, a solution was coated on the substrate by spin coating at 2,500 rpm; the solution was obtained by dissolving, into a solvent, the same block copolymer as that used in Example 3. The substrate was then pre-baked at 110° C. for 90 seconds to vaporize the solvent. Then, the block copolymer film was annealed in a nitrogen atmosphere at 210° C. for four hours to separate PS from PMMA in the block copolymer.

The phase-separated substrate with the block copolymer was dry etched by RIE at an $O_2$ flow rate of 30 sccm, a pressure of 13.3 Pa (100 mTorr), and a power of 100 W to etch PS and PMMA in the film subjected to phase separation. On this occasion, owing to the difference in etching speed between PS and PMMA, PMMA was selectively etched with the PS pattern remaining. Using the PS pattern as a mask, the SOG was dry etched by CF4 RIE at a $CF_4$ flow rate of 30 sccm, a pressure of 1.33 Pa (10 mTorr), and a power of 100 W. Thus, the SOG mask pattern 39 was formed as shown in FIG. 8(c).

Then, the substrate was dry etched by ICP at $BCl_3/Cl_2$=5/20 sccm, 0.266 Pa (2 mTorr), and incidence power/bias power=100/100 W for three minutes. A cylindrical pattern was thus formed as shown in FIG. 8(d). Subsequently, the cylindrical pattern was sputtered by Ar gas in the same manner as in Example 1 to form fine concaves and convexes having conical, cylindrical, and mesa portions as shown in FIG. 8(e).

As a result of etching, fine concaves and convexes having conical, cylindrical, and mesa portions could be formed; the conical, cylindrical, and mesa portions had the following shape. The average diameter of the bottom of the mesa portion 21 was 170 nm. The average diameter of the top of the mesa portion 21 was 100 nm. The average height of the mesa portion 21 was 120 nm. The average diameter of the cylindrical portion 22 was 100 nm. The average height of the cylindrical portion 22 was 450 nm. The average diameter of the conical portion 23 was 100 nm. The average height of the conical portion 23 was 150 nm. The period between the convex structures was 180 nm.

The luminescence of a light emitting diode tip having its concave and convex surface increased 120% compared with that of a light emitting diode tip not having its concave and convex surface.

Example 9

SOG was formed on the front surface of the GaP current diffusion layer 15 in the same manner as in Example 7; the GaP current diffusion layer 15 corresponds to the light emitting diode used in Example 1. Moreover, a solution was coated on the substrate by spin coating at 2,500 rpm; the solution was obtained by dissolving, into a solvent, the same block copolymer as that used in Example 3. The substrate was then pre-baked at 110° C. for 90 seconds to vaporize the solvent. Then, the block copolymer film was annealed in a nitrogen atmosphere at 210° C. for four hours to separate PS from PMMA in the block copolymer.

The phase-separated substrate with the block copolymer was dry etched by RIE at an $O_2$ flow rate of 30 sccm, a pressure of 13.3 Pa (100 mTorr), and a power of 100 W to etch PS and PMMA in the film subjected to phase separation. A PS pattern was thus formed. Using the PS pattern as a mask, the SOG was dry etched by CF4 RIE at a $CF_4$ flow rate of 30 sccm, a pressure of 1.33 Pa (10 mTorr), and a power of 100 W.

Then the substrate was dry etched by ICP at $BCl_3/Cl_2/CF_4$=5/20/5 sccm, 0.266 Pa (2 mTorr), and incidence power/bias power=100/100 W for three minutes. A cylindrical pattern was thus formed. Subsequently, the cylindrical pattern was sputtered by Ar gas in the same manner as in Example 1 to form fine concaves and convexes having a conical, cylindrical, and mesa portions.

As a result of etching, fine concaves and convexes having a conical, cylindrical, and mesa portions could be formed; the conical, cylindrical, and mesa portions had the following shape. The average diameter of the bottom of the mesa portion 21 was 180 nm. The average diameter of the top of the mesa portion 21 was 110 nm. The average height of the mesa portion 21 was 150 nm. The average diameter of the cylindrical portion 22 was 110 nm. The average height of the cylindrical portion 22 was 500 nm. The average diameter of the conical portion 23 was 110 nm. The average height of the conical portion 23 was 180 nm. The period between the convex structures was 190 nm.

The luminescence of a light emitting diode tip having its concave and convex surface increased 150% compared with that of a light emitting diode tip not having its concave and convex surface.

Example 10

A block copolymer was mixed with a PMMA homopolymer so that their weight ratio was 6:4; the block copolymer contained PS of molecular weight 300,000 and PMMA of molecular weight 420,000 and had an Mw/Mn=1.07 and the PMMA homopolymer had a molecular weight of 15,000. Then, a PGMEA solution was adjusted to obtain containing 3 wt % of block copolymer and 3 wt % of PMMA homopolymer. This solution was coated on the front surface of the GaP light emitting layer 15 by spin coating at 2,500 rpm; the GaP light emitting layer 15 corresponded to the light emitting diode used in Example 1. The substrate was then pre-baked at 110° C. for 90 seconds to vaporize the solvent. Then, the block copolymer film was annealed in a nitrogen atmosphere at 210° C. for four hours to separate PS from PMMA in the block copolymer.

The phase-separated substrate with the block copolymer was dry etched by RIE at an $O_2$ flow rate of 30 sccm, a pressure of 13.3 Pa (100 mTorr), and a power of 100 W to etch PS and PMMA, separated from each other. $O_2$ etching cannot etch GaP but can selectively etch PMMA. Since the etching rate ratio of PS to PMMA is 1:4, PMMA was selectively etched with the PS pattern remaining. The PS pattern had a thickness of about 130 nm.

Using the PS pattern as a mask, the substrate was dry etched by ICP at $BCl_3/Cl_2$=5/20 sccm, 0.266 Pa (2 mTorr), and incident power/bias power=100/100 W for 150 seconds. As a result, a fine cylindrical pattern of diameter 100 nm and height 450 nm was formed. Subsequently, the $O_2$ asher was used to remove the remaining PS. Then, the cylindrical pattern was sputtered by Ar gas as in the case of Example 1 to form fine concaves and convexes having conical, cylindrical, and mesa portions.

As a result, the fine concaves and convexes having the conical, cylindrical, and mesa portions could be formed on the front surface of the GaP light emitting layer. The average diameter of the bottom of the mesa portion 21 was 160 nm. The average diameter of the top of the mesa portion 21 was 90 nm. The average height of the mesa portion 21 was 100 nm. The average diameter of the cylindrical portion 22 was 90 nm. The average height of the cylindrical portion 22 was 350 nm. The average diameter of the conical portion 23 was 90 nm. The average height of the conical portion 23 was 110 nm. The period between the convex structures was 180 nm.

A light emitting diode having its concave and convex surface was made a tip. The luminescence of a light emitting diode tip having its concave and convex surface increased 70% compared with that of a light emitting diode tip not having its concave and convex surface.

The reason why the luminance was higher than that in Example 3 is probably as follows. The addition of the PMMA homopolymer to the block copolymer increased the regularity of the phase separation structure, thus improving diffraction efficiency.

Example 11

In this example, a PS (polystyrene)-PI (polyisoprene) diblock copolymer (PS of molecular weight (Mw) 230,000 and PI of molecular weight 400,000 and Mw/Mn=1.06) was used as a phase separation polymer, and a low molecular-weight homopolymer (molecular weight Mw: 2,000 and Mw/Mn: 1.45). That is, the low molecular-weight homopolymer of PI was added to the PS-PI diblock and dissolved into PGEMEA to obtain a solution in the same manner as that used in Example 9.

A process similar to that in Example 9 was used. That is, the mixture of the PS-PI diblock copolymer and PI homopolymer was formed into a thin film on the GaP current diffusion layer 15 of the light emitting element substrate 10. The substrate was annealed to produce a micro phase separation structure. Then, an ozone oxidation method was used to remove PI to produce a PS mask on the substrate. Subsequently, a light emitting element was produced in the same manner as that used in Example 9.

to remove PMMA from the phase-separated polymer film. Then, using the remaining PS pattern as a mask, the substrate was dry etched by RIE at $Cl_2$=50 sccm, 0.266 Pa (2 mTorr), and a power of 300 W to form a fine pattern on the current diffusion layer. Subsequently, the $O_2$ asher was used to remove the remaining PS.

Subsequently, the cylindrical pattern was sputtered by Ar gas at Ar=50 sccm, 0.65 Pa (5 mTorr), and a power of 300 W for 60 sec. Thus, the bottom side and the top of the cylinder were sputtered to form a mesa portion and a conical portion.

As a result, fine concaves and convexes with conical, cylindrical, and mesa portions could be formed on a part of surface of the current diffusion layer on which electrodes and wiring patterns were not formed; the current diffusion layer forms a light extracted surface.

A light emitting diode having its concave and convex surface was made a tip. The table (Table 3) below shows increases in luminance achieved.

TABLE 3

| | Diameter of mesa portion | Height of mesa portion | Diameter of cylindrical portion | Height of cylindrical portion | Diameter of conical portion | Height of conical portion | Internal of convex portion | Increase in luminance |
|---|---|---|---|---|---|---|---|---|
| 1 | 160 nm | 100 nm | 100 nm | 300 nm | 100 nm | 100 nm | 170 nm | 60% |
| 2 | 270 nm | 150 nm | 200 nm | 500 nm | 200 nm | 150 nm | 300 nm | 50% |
| 3 | 400 nm | 200 nm | 300 nm | 700 nm | 300 nm | 200 nm | 430 nm | 40% |

As a result, the luminescence of a light emitting diode tip having its concave and convex surface increased 100% compared with that of a light emitting diode tip not having its concave and convex surface.

Example 12

A blend polymer was obtained by adding PMMA of molecular weight 15,000 and a PS homopolymer of molecular weight 9,000 to a block copolymer containing PS of molecular weight 240,000 and PMMA of molecular weight 730,000 and having an Mw/Mn of 1.08. The blend polymer was formed into a thin film on the current diffusion layer of the light emitting element substrate. The table (Table 2) below shows the mixture rate of the PS-PMMA block copolymer, PMMA homopolymer, and PS homopolymer and the diameter of PS in the micro phase separation pattern thus obtained.

TABLE 2

| | PS-PMMA:PMA:PS | Diameter of PS |
|---|---|---|
| 1 | 8:2:6 | 100 nm |
| 2 | 8:4:1.5 | 200 nm |
| 3 | 8:4:2.5 | 300 nm |

This indicates that the size of PS spherical pattern of PS is increased by addition of PS. The patterning method used in the present invention requires the film thickness to be set equivalent to the diameter of a PS sphere. Thus, the polymer thin film was coated on the GaP current diffusion layer 15 on which the electrode had been produced, while adjusting the concentration of the polymer and the rotation speed of spin coating so that the film thickness was almost the same as the diameter obtained. The substrate was then annealed in the same manner as described above to generate a phase separation structure in the film. The phase-separated substrate with the block copolymer was dry etched by RIE at an $O_2$=30 sccm, a pressure of 1.33 Pa (10 mTorr), and a power of 100 W As described above, the size of the phase separation pattern of the block copolymer can be increased by adding, to the block copolymer, homopolymers corresponding to majority and minority phases of the block copolymer. Further, since it is possible to increase the height of PS, which constitutes the mask with which the compound semiconductor is etched, the compound semiconductor can be etched deeper. This method is effective when it is difficult to increase the molecular weight or for reducing differences among lots.

Example 13

Figure 10:
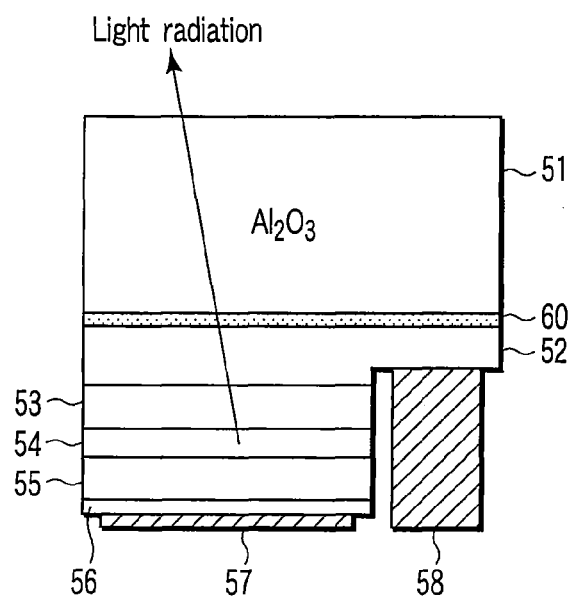
FIG. 10 is a sectional view showing the element structure of a light emitting diode according to a thirteenth example.

FIG. 10 is a sectional view of the element structure of a light emitting diode according to a thirteenth example of the present invention.

The light emitting diode according to the present example emits ultraviolet light (UV light).

First, as described below, an SiNx pattern was formed on a crystal $Al_2O_3$ substrate 51 as an etching mask. That is, a thickness of 200 nm SiNx was deposited by a plasma CVD method on the crystal $Al_2O_3$ substrate 51. A solution was then coated on SiNx by the spin coating method at 3,000 rpm; the solution is obtained by dissolving, into PGMEA, a block copolymer containing PS of molecular weight 315,000 and PMMA of molecular weight 785,000 and having an Mw/Mn of 1.06. Subsequently, the substrate was pre-baked at 110° C. for 90 seconds to vaporize the solvent. A film thickness of 150 nm was thus obtained.

Then, the block copolymer film was annealed in a nitrogen atmosphere at 180° C. for four hours to separate PS from PMMA. A polystyrene dot pattern of diameter about 110 nm was formed. The phase-separated crystal $Al_2O_3$ substrate with the block copolymer was dry etched by RIE at an $O_2$=30 sccm, a pressure of 13.3 Pa (100 mTorr), and a power of 100 W to selectively etch PMMA, separated from PS. As a result, aggregated polystyrene of size about 0.1 μm remained at periods of about 0.1 μm; the polystyrene constitutes a mask used to form an SiNx pattern.

The SiNx was then etched at Ar/CHF$_3$=185/15 sccm, a pressure of 40 mTorr, and a power of 100 W for 6.5 minutes to form an SiNx pattern as an etching mask. Then, Using the SiNx pattern as an etching mask, the crystal Al$_2$O$_3$ substrate was dry etched by RIE at BCl$_3$/Cl$_2$=5/20 sccm, a pressure of 5 mTorr, and a power of 100 W for 20 minutes. Subsequently, the cylindrical pattern of Al2O3 was sputtered by Ar gas at Ar=50 sccm, a pressure of 0.65 Pa (5 mTorr), and a power of 300 W for five minutes. Thus, the bottom side and the top of the cylinder were sputtered to form a mesa portion and a conical portion.

Thus, fine concaves and convexes (convex structures 60) having conical, cylindrical, and mesa portions could be formed on the front surface of the crystal Al$_2$O$_3$ substrate. The average diameter of the bottom of the mesa portion was 120 nm. The average diameter of the top of the mesa portion was 80 nm. The average height of the mesa portion was 90 nm. The average diameter of the cylindrical portion was 80 nm. The average height of the cylindrical portion was 250 nm. The average diameter of the conical portion was 80 nm. The average height of the conical portion was 100 nm. The period between the convex structures was 170 nm.

Then, a CVD process was used to sequentially grow and form the following layers on the surface of the crystal Al$_2$O$_3$ substrate on which the concaves and convexes had been formed: an n-Al$_{0.4}$Ga$_{0.6}$N (contact layer) 52, an n-Al$_{0.35}$Ga$_{0.65}$N (clad layer) 53, an n-Al$_{0.28}$Ga$_{0.72}$N/n-Al$_{0.24}$Ga$_{0.76}$N (SL active layer) 54, a p-Al$_{0.4}$Ga$_{0.6}$N/p-Al$_{0.3}$Ga$_{0.7}$N(SL clad layer) 55, and a p-GaN (contact layer) 56. Subsequently, the layers from the contact layer 56 to the clad layer 53 are selectively removed to expose a part of the contact layer 52. Then, a p-side electrode 57 was formed on the contact layer 56, whereas an n-side electrode 58 was formed on the contact layer 52. The substrate was then cut to obtain a chip constituting a light emitting element.

The configuration of the device produced is as shown in FIG. 10. A light emitted by the active layer 54 is extracted from the substrate back surface through the substrate 51. The light emitting element according to the present example was compared with a light emitting element without any convex structures in terms of the emission intensity of ultraviolet light (λ=300 nm). The luminance of the device with the convex structures increased about 40% compared with that not provided with concaves or convexes. Thus, the structure obtained according to the present example was confirmed to be also effective on UV light.

Example 14

In contrast to the light emitting diode (UV-LED) having the convex structures 60 produced on the front surface of the crystal Al$_2$O$_3$ substrate 51 according to Example 13, the light emitting diode emitting ultraviolet light, a phosphor was placed on the back surface of the substrate 51 to emit white light. The phosphors are shown in Table 4.

TABLE 4

| Phosphor | Color: wavelength | Composition ratio |
| --- | --- | --- |
| ZnS: Cu, Al | Green: λ = 530 nm | 22.80% |
| Y2O2S: Eu | Red: λ = 626 nm | 55.80% |
| BaNgAl1017: Eu | Blue: λ = 454 nm | 21.40% |

Each of these phosphors was formed into a thin film on a light emitting surface of an LED (back surface of the substrate 51 in FIG. 10) and sealed with an epoxy resin. This LED was compared with an LED with a similar phosphor but without any convex structures in terms of the luminance of a white light. The luminance of the LED with concaves and convexes increased 30% compared with that of LED without any convex structures. As a result, the structure obtained according to the present example was confirmed to be also effective on white LED with a phosphor.

Example 15

Figure 11:
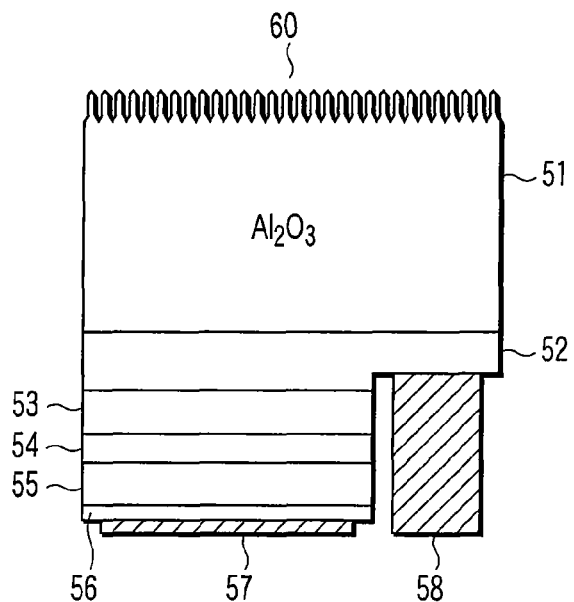
FIG. 11 is a sectional view showing the element structure of a light emitting diode according to a fifteenth example.

FIG. 11 is a sectional view of the element structure of a light emitting diode according to a fifteenth example of the present invention. In the figure, the same components as those shown in FIG. 10 have the same reference numerals. A detailed description of these components is omitted. The light emitting diode according to the present example also emits ultraviolet light (UV light) as in the case of Example 13.

The CVD process was used to sequentially grow and form the following layers on the surface of the crystal Al$_2$O$_3$ substrate: the n-Al$_{0.4}$Ga$_{0.6}$N (contact layer) 52, the n-Al$_{0.35}$Ga$_{0.65}$N (clad layer) 53, the n-Al$_{0.28}$Ga$_{0.72}$N/n-Al$_{0.24}$Ga$_{0.76}$N (SL active layer) 54, the p-Al$_{0.4}$Ga$_{0.6}$N/p-Al$_{0.3}$Ga$_{0.7}$N (SL clad layer) 55, and the p-GaN (contact layer) 56. Subsequently, the layers from the contact layer 56 to the clad layer 53 are selectively removed to expose a part of the contact layer 52. Then, the p-side electrode 57 was formed on the contact layer 56, whereas the n-side electrode 58 was formed on the contact layer 52. A light emitting diode (UV-LED) was produced.

An SiNx pattern was formed on the surface of the substrate which was opposite that on which the above layers had been stacked by the CVD process. A thickness of 200 nm of SiNx was deposited by a plasma CVD method on the crystal Al$_2$O$_3$ substrate 51. A solution was then coated on SiNx by the spin coating method at 3,000 rpm; the solution is obtained by dissolving, into PGMEA, a block copolymer containing PS of molecular weight 315,000 and PMMA of molecular weight 785,000 and having an Mw/Mn of 1.06. Subsequently, the substrate was pre-baked at 110° C. for 90 seconds to vaporize the solvent. A film thickness of 150 nm was thus obtained.

Then, the block copolymer film was annealed in a nitrogen atmosphere at 180° C. for four hours to separate PS from PMMA. A polystyrene dot pattern of diameter about 110 nm was formed. The phase-separated crystal Al$_2$O$_3$ substrate 51 with the block copolymer was dry etched by RIE at an O$_2$=30 sccm, a pressure of 13.3 Pa (100 mTorr), and a power of 100 W to selectively etch PMMA, separated from PS. As a result, aggregated polystyrene of size about 0.1 μm remained at periods of about 0.1 μm; the polystyrene constitutes a mask used to form an SiNx pattern.

The SiNx was then etched at Ar/CHF$_3$=185/15 sccm, 40 mTorr, and 100 W for 6.5 minutes to form an SiNx pattern as an etching mask. Then, Using the SiNx pattern as an etching mask, crystal Al$_2$O$_3$ substrate 51 was dry etched by RIE at BCl$_3$/Cl$_2$=5/20 sccm, a pressure of 5 mTorr, and a power of 100 W for 20 minutes. Subsequently, the cylindrical pattern of Al2O3 was sputtered by Ar gas at an Ar flow rate of 50 sccm, a pressure of 0.65 Pa (5 mTorr), and a power of 300 W for five minutes. Thus, the bottom side and the top of the cylinder were sputtered to form a mesa portion and a conical portion.

Thus, fine concaves and convexes (convex structures 60) having a conical, cylindrical, and mesa portions could be formed on the front surface of the crystal Al$_2$O$_3$ substrate 51. The average diameter of the bottom of the mesa portion was 110 nm. The average diameter of the top of the mesa portion was 80 nm. The average height of the mesa portion was 90 nm. The average diameter of the cylindrical portion was 80 nm. The average height of the cylindrical portion was 250 nm. The average diameter of the conical portion was 80 nm. The average height of the conical portion was 100 nm. The period between the convex structures was 170 nm.

The configuration of the device produced is as shown in FIG. 11. The light emitting element according to the present example was compared with a light emitting element without any convex structures in terms of the emission intensity of ultraviolet light (λ=300 nm). The luminance of the device with the convex structures increased about 50% compared with that not provided with concaves or convexes. Thus, the structure obtained according to the present example was confirmed to be also effective on UV light.

Example 16

In contrast to UV-LED having the convex structures 60 produced on the back surface of the crystal $Al_2O_3$ substrate 51 according to Example 15, a phosphor was placed on the back surface of the substrate 51 to emit white light. The phosphors are shown in Table 4, described above.

Each of these phosphors was formed into a thin film on the light emitting surface of an LED (back surface of the substrate 51 in FIG. 11) and sealed with an epoxy resin. This LED was compared with an LED with a similar phosphor but without any convex structures in terms of the luminance of a white beam. The luminance of the LED with concaves and convexes increased 35% compared with that of LED without any convex structures.

Example 17

Figure 12:
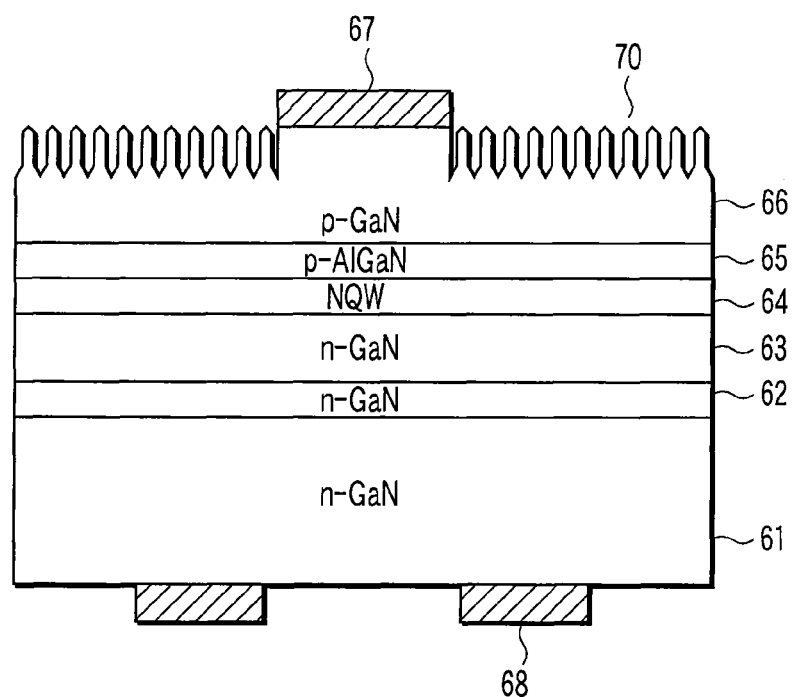
FIG. 12 is a sectional view showing the element structure of a light emitting diode according to a seventeenth example.
Figure 13A:
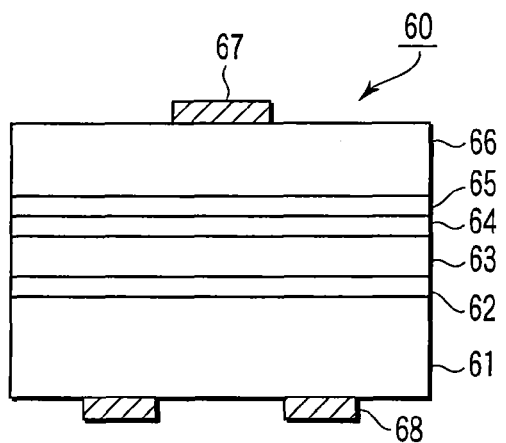
FIGS. 13A to 13E are sectional views showing a process for manufacturing the light emitting diode according to the seventh example.
Figure 13B:
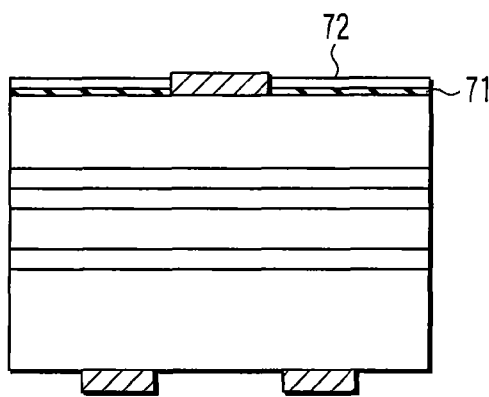
Figure 13C:
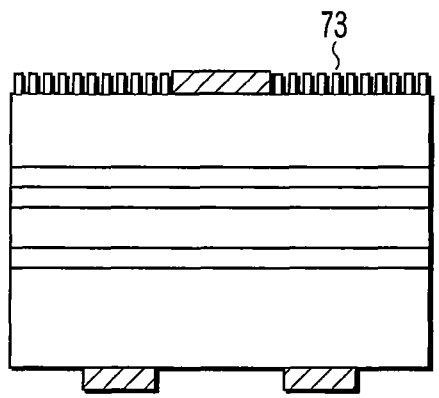
Figure 13D:
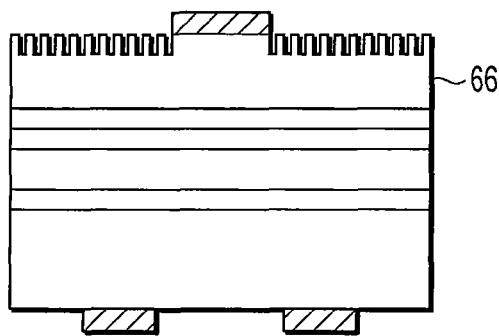
Figure 13E:
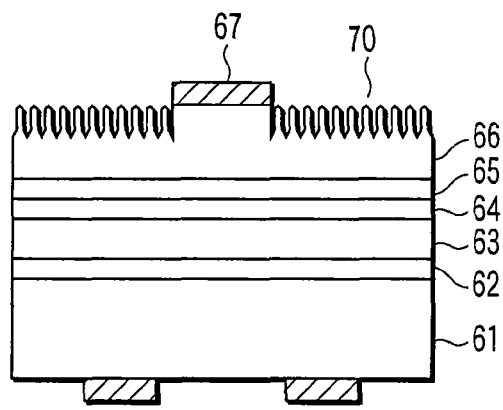

FIG. 12 is sectional view of the element structure of a light emitting diode according to a seventeenth example of the present invention.

The following layers are grown and formed on an n-type GaN substrate 61: an n-type GaN buffer layer 62, an n-type GaN clad layer 63, an MQW active layer 64 consisting of InGaN/GaN, a p-type AlGaN cap layer 65, and a p-type GaN contact layer 66. A p-side electrode 67 is formed on a part of the contact layer 66. An n-side electrode 68 is formed on the back surface of the substrate 61. This light emitting diode has an emission wavelength of 400 nm. Convex structures 70 characteristic of the present example are formed on a part of surface of the contact layer 66 on which the electrode 67 is not formed.

Now, description will be given of a method for manufacturing a light emitting diode according to the present example.

First as shown in FIG. 13(*a*), the n-GaN buffer layer 62 and the n-CaN clad layer 63 are grown and formed on the n-GaN substrate 61 by the MOCVO method. The MQW active layer 64 consisting of InGaN/GaN was grown and formed on the n-GaN clad layer 63. The p-AlGaN cap layer 65 and the p-GaN contact layer 66 were further grown and formed on the MQW active layer 64 by the MOCVD method. Then, the p-side electrode 67 is formed on the contact layer 66. The n-side electrode 68 is formed on the back surface of the substrate 61. The electrodes 67 and 68 are machined into desired patterns. Thus a light emitting element substrate 60 was produced.

Then, as shown in FIG. 13(*b*), a process similar to that in Example 9 was used. That is, an SOG film 71 was formed on the light emitting element substrate 60 to a thickness of 100 nm. A solution 72 was then coated on the light emitting element substrate 10 by spin coating at a rotation speed of 2,500 rpm; the solution 72 contained a block copolymer dissolved into a solvent. The light emitting element substrate 60 was then pre-baked at 110° C. for 90 seconds to vaporize the solvent. Subsequently, the block copolymer film was annealed in a nitrogen atmosphere at 210° C. for four hours to separate PS from PMMA in the block copolymer.

Then, as shown in FIG. 13(*c*), the phase-separated substrate with the block copolymer was dry etched by RIE at an $O_2$ flow rate of 30 sccm, a pressure of 13.3 Pa (100 mTorr), and a power of 100 W to etch PS and PMMA, separated from each other in the film. A PS pattern 73 was thus formed. Then, Using the PS pattern 73 as a mask, SOG was dry etched by RIE at a $CF_4$ flow rate of 30 sccm, a pressure of 1.33 Pa (10 mTorr), and a power of 100 W.

Then, as shown in FIG. 13(*d*), using the SOG mask, the substrate was dry etched by ICP at $BCl_3/Cl_2$=5/20 sccm, 0.266 Pa (2 mTorr), and incident power/bias power=100/100 W for 150 seconds. As a result, a cylindrical pattern was formed.

Then, as shown in FIG. 13(*e*), the cylindrical pattern was sputtered by Ar gas at Ar=50 sccm, a pressure of 0.65 Pa (5 mTorr), and a power of 300 W for two minutes. Thus, the bottom side and the top of the cylinder were sputtered to form a mesa portion and a conical portion. As a result of etching, fine concaves and convexes with a conical, cylindrical, and mesa portions could be formed; the conical, cylindrical, and mesa portions had the following shape. The average diameter of the bottom of the mesa portion was 140 nm. The average diameter of the top of the mesa portion was 100 nm. The average height of the mesa portion was 100 nm. The average diameter of the cylindrical portion was 100 nm. The average height of the cylindrical portion was 400 nm. The average diameter of the conical portion was 100 nm. The average height of the conical portion was 100 nm. The period between the convex structures was 180 nm.

The sample according to the example was compared with a sample without a pattern in terms of emission efficiency. Then, the luminance of the sample according to the example was confirmed to be 80% higher than that of the sample without a pattern.

Example 18

The light emitting element substrate 10 comprising the GaP light emitting layer surface was immersed into a water solution in which PS spheres (density: 1.05) of diameter 200 nm were dispersed; the light emitting element substrate 10 was used the light emitting diode in Example 1. Subsequently, the substrate 10 was lifted at a speed of 10 μm/sec under conditions including a temperature of 25° C. and a humidity of 40%. During the lifting, owing to the presence of an interface between the substrate surface and the surface of the water solution and the air, that is, what is called a meniscus line, the PS spheres were attracted to the substrate surface along the meniscus line. Consequently, the PS spheres were configured on the substrate surface as a monolayer (FIG. 6(*b*)).

Using PS spheres as a mask, the substrate was dry etched by ICP at $BCl_3/Cl_2$=5/20 sccm, 0.266 Pa (2 mTorr), and incident power/bias power=100/100 W for two minutes. As a result, a cylindrical pattern was formed (FIG. 6(*c*)). Subsequently, the cylindrical pattern was sputtered by Ar gas in the same manner as that used in Example 1 to form fine concaves and convexes with conical, cylindrical, and mesa portions as shown in FIG. 6(*d*).

As a result of etching, the fine concaves and convexes with the conical, cylindrical, and mesa portions could be formed; the conical, cylindrical, and mesa portions had the following shape. The average diameter of the bottom of the mesa portion was 200 nm. The average diameter of the top of the mesa portion was 150 nm. The average height of the mesa portion was 100 nm. The average diameter of the cylindrical portion was 150 nm. The average height of the cylindrical portion was 300 nm. The average diameter of the conical portion was 150 nm. The average height of the conical portion was 120 nm. The period between the convex structures was 220 nm.

The sample according to the example was compared with a sample without a pattern in terms of emission efficiency. Then, the luminance of the sample according to the example was confirmed to be 60% higher than that of the sample without a pattern.

Example 19

A light emitting element substrate comprising a GaP light extracted surface was immersed into a water solution in which PS spheres (density: 1.05) of diameter 200 nm were dispersed; the light emitting element substrate was the light emitting diode used in Example 1. Subsequently, the substrate 10 was lifted in the same manner as that used in Example 18. Consequently, the PS spheres are configured on the substrate surface as a monolayer.

Using PS spheres as a mask, the substrate was dry etched by ICP at $BCl_3/Cl_2 = 5/20$ sccm, 0.266 Pa (2 mTorr), and incident power/bias power=100/100 W for three minutes. As a result, a cylindrical pattern was formed. Subsequently, the cylindrical pattern was sputtered by Ar gas in the same manner as that used in Example 1 to form fine concaves and convexes with conical, cylindrical, and mesa portions as shown in the figures.

As a result of etching, the fine concaves and convexes with the conical, cylindrical, and mesa portions could be formed; the conical, cylindrical, and mesa portions had the following shape. The average diameter of the bottom of the mesa portion was 500 nm. The average diameter of the top of the mesa portion was 350 nm. The average height of the mesa portion was 150 nm. The average diameter of the cylindrical portion was 350 nm. The average height of the cylindrical portion was 450 nm. The average diameter of the conical portion was 350 nm. The average height of the conical portion was 150 nm. The period between the convex structures was 550 nm.

The sample according to the example was compared with a sample without a pattern in terms of emission efficiency. Then, the luminance of the sample according to the example was confirmed to be 30% higher than that of the sample without a pattern. The use of the PS spheres as in the present example makes it possible to easily form convex structures of a size that is difficult to form by a block copolymer.

Example 20

A light emitting element substrate comprising a GaP light extracted surface was immersed into a water solution in which silica spheres (density: 2.0) of diameter 200 nm were dispersed; the light emitting element substrate was the light emitting diode used in Example 1. Subsequently, the substrate was lifted in the same manner as that used in Example 18. Consequently, the silica spheres are configured on the substrate surface as a monolayer (FIG. 6(b)).

Using silica spheres as a mask, the substrate was dry etched by ICP at $BCl_3/Cl_2 = 5/20$ sccm, 0.266 Pa (2 mTorr), and incident power/bias power=100/100 W for three minutes. As a result, a cylindrical pattern was formed (FIG. 6(c)). Subsequently, the cylindrical pattern was sputtered by Ar gas in the same manner as that used in Example 1 to form fine concaves and convexes with conical, cylindrical, and mesa portions as shown in FIG. 6(d).

As a result of etching, the fine concaves and convexes with the conical, cylindrical, and mesa portions could be formed; the conical, cylindrical, and mesa portions had the following shape. The average diameter of the bottom of the mesa portion was 200 nm. The average diameter of the top of the mesa portion was 150 nm. The average height of the mesa portion was 150 nm. The average diameter of the cylindrical portion was 150 nm. The average height of the cylindrical portion was 450 nm. The average diameter of the conical portion was 150 nm. The average height of the conical portion was 150 nm. The period between the convex structures was 220 nm.

The sample according to the example was compared with a sample without a pattern in terms of emission efficiency. Then, the luminance of the sample according to the example was confirmed to be 130% higher than that of the sample without a pattern. Thus, a higher concave and convex shape can be formed because the silica spheres have high resistance to chlorine-based etching and provide a higher etching rate ratio than the PS spheres.

Example 21

FIG. 14 is shown a process for manufacturing a light emitting diode according to a twenty first embodiment of the present invention. In the figure, the same components as those shown in FIG. 13 have the same reference numerals. A detailed description of these components is omitted.

Figure 14A:
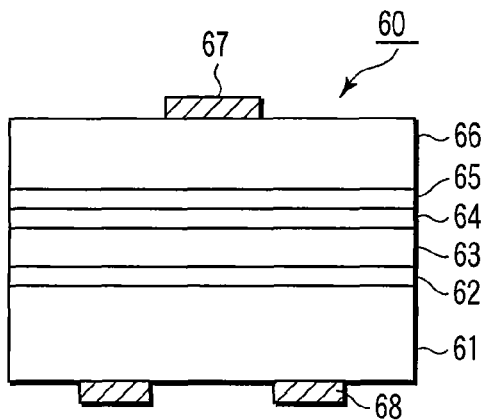
FIGS. 14A to 14D are sectional views showing a process for manufacturing a light emitting diode according to a twenty first example.
Figure 14B:
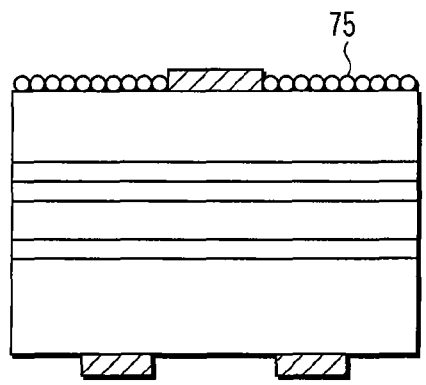

As shown in FIG. 14(a), the device formation substrate 60 was prepared, which had a structure similar to that of Example 17. Then, as shown in FIG. 14(b), the front surface (GaN contact layer) of the device formation substrate 60 was immersed into a water solution in which silica spheres (density: 2.0) of diameter 300 nm were dispersed. Subsequently, the substrate 60 was lifted in the same manner as that used in Example 18. Consequently, silica spheres 75 are configured on the substrate surface as a monolayer.

Figure 14C:
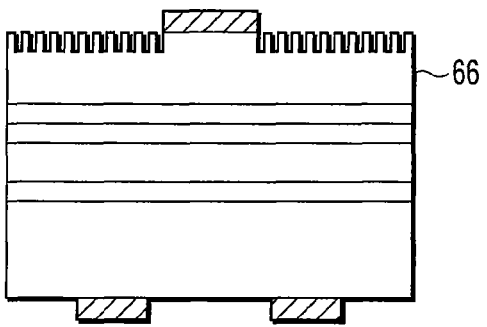
Figure 14D:
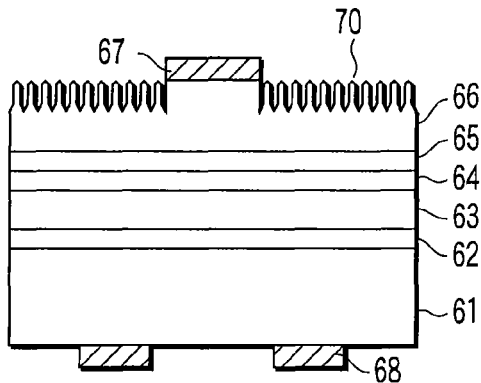

Then, as shown in FIG. 14(c), using silica spheres as a mask, the substrate was dry etched by ICP at $BCl_3/Cl_2 = 5/20$ sccm, 0.266 Pa (2 mTorr), and incident power/bias power=100/100 W for three minutes. As a result, a cylindrical pattern was formed. Subsequently, the cylindrical pattern was sputtered by Ar gas in the same manner as that used in Example 1 to form fine concaves and convexes with conical, cylindrical, and mesa portions as shown in FIG. 14(d).

As a result of etching, the fine concaves and convexes with the conical, cylindrical, and mesa portions could be formed; the conical, cylindrical, and mesa portions had the following shape. The average diameter of the bottom of the mesa portion was 300 nm. The average diameter of the top of the mesa portion was 170 nm. The average height of the mesa portion was 220 nm. The average diameter of the cylindrical portion was 170 nm. The average height of the cylindrical portion was 500 nm. The average diameter of the conical portion was 170 nm. The average height of the conical portion was 200 nm. The period between the convex structures was 250 nm.

The sample according to the example was compared with a sample without a pattern in terms of emission efficiency. Then, the luminance of the sample according to the example was confirmed to be 90% higher than that of the sample without a pattern. Thus, in the present example, GaN could be etched deeper, thus increasing the luminance.

Example 22

EB Drawing

An electron beam resist (FEP-301 manufactured by FUJI PHOTO FILM CO., LTD.) was formed on the light emitting element substrate 10 comprising a GaP light emitting layer surface and which was the light emitting diode in Example 1. A circular pattern of size 150 nm was generated using an electron beam exposure apparatus equipped with a pattern generator and having an acceleration voltage of 50 kV (FIG. 7(b)).

Using the resist pattern, the substrate was dry etched by ICP at $BCl_3/Cl_2=5/20$ sccm, 0.266 Pa (2 mTorr), and incident power/bias power=100/100 W for three minutes. As a result, a cylindrical pattern was formed (FIG. 7(c)).

Subsequently, the cylindrical pattern was sputtered by Ar gas at Ar=50 sccm, a pressure of 0.65 Pa (5 mTorr), and a power of 300 W for two minutes. Thus, the bottom side and the top of the cylinder were sputtered to form a mesa portion and a conical portion as shown in FIG. 7(d).

As a result of etching, fine concaves and convexes with a conical, cylindrical, and mesa portions could be formed; the conical, cylindrical, and mesa portions had the following shape. The average diameter of the bottom of the mesa portion was 200 nm. The average diameter of the top of the mesa portion was 150 nm. The average height of the mesa portion was 100 nm. The average diameter of the cylindrical portion was 150 nm. The average height of the cylindrical portion was 400 nm. The average diameter of the conical portion was 150 nm. The average height of the conical portion was 100 nm. The period between the convex structures was 220 nm.

The sample according to the example was compared with a sample without a pattern in terms of emission efficiency. Then, the luminance of the sample according to the example was confirmed to be 100% higher than that of the sample without a pattern.

The present invention is not limited to the above embodiments. Many variations may be made to the embodiments without departing from the concept of the present invention. Any of the examples can be appropriately combined together.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor light emitting device comprising a semiconductor light emitting element, the method comprising:
    forming a mask on which circular patterns are periodically arranged, on a light extracted surface of a semiconductor light emitting element,
    selectively etching the light extracted surface of the semiconductor light emitting element by a reactive ion etching technique using the mask to form convex structures each including a conical mesa portion, a cylindrical portion, and a conical portion, the mesa portion, the cylindrical portion, and the conical portion being arranged in this order from the light extracted surface, a period between the convex structures being longer than 1/(a refractive index of an external medium+a refractive index of the convex structures) of an emission wavelength and equal to or shorter than the emission wavelength, and a circle-equivalent average diameter of the cylindrical portion being substantially constant from the mesa portion to the conical portion and being within a range of ⅓ to 9/10 of a circle-equivalent average diameter of a bottom of the mesa portion.

2. The method according to claim 1, wherein the light extracted surface is formed of a light radiation side outermost layer or an inorganic light transmission layer of the semiconductor light emitting element.

3. The method according to claim 1, wherein in order to form the mask, a resist is formed on the light extracted surface and the circular patterns are drawn on the resist by a lithography technique using electron light or light.

4. The method according to claim 1, wherein in order to form the mask, a thin film formed of a resin composition which contains a block copolymer or graft copolymer and which forms a micro phase separation structure in a self-organizing manner is formed on the light extracted surface and at least one of phases of the micro phase separation structure of the thin film is selectively removed.

5. The method according to claim 1, wherein in order to form the mask, polymer beads or silica beads configured in a monolayer are formed on the light extracted surface.

6. A method for manufacturing a semiconductor light emitting device comprising a semiconductor light emitting element, the method comprising:
    forming a mask on which circular patterns are periodically configured, on a light extracted surface of a semiconductor light emitting element;
    selectively etching the light extracted surface by a reactive ion etching technique using the mask to form a cylindrical portion of each of convex structures configuring a diffraction grating structure and setting a period between the convex structures longer than 1/(a refractive index of an external medium+a refractive index of the convex structures) of an emission wavelength and equal to or shorter than the emission wavelength; and
    etching the light extracted surface by a physical etching technique using an inert gas to form a conical mesa portion at a bottom of each of the cylindrical portions, forming a conical portion at a top of the cylindrical portion, and setting a circle-equivalent average diameter of the cylindrical portion to be substantially constant from the mesa portion to the conical portion and to be within a range of ⅓ to 9/10 of a circle-equivalent average diameter of a bottom of the mesa portion.

7. The method according to claim 6, wherein the light extracted surface is formed of a light radiation side outermost layer or an inorganic light transmission layer of the semiconductor light emitting element.

8. The method according to claim 6, wherein in order to form the mask, a resist is formed on the light extracted surface and the circular patterns are drawn on the resist by a lithography technique using electron light or light.

9. The method according to claim 6, wherein in order to form the mask, a thin film formed of a resin composition which contains a block copolymer or graft copolymer and which forms a micro phase separation structure in a self-organizing manner is formed on the light extracted surface and at least one of phases of the micro phase separation structure of the thin film is selectively removed.

10. The method according to claim 6, wherein in order to form the mask, polymer beads or silica beads configured in a monolayer are formed on the light extracted surface.

* * * * *